(12) United States Patent
Wu et al.

(10) Patent No.: US 12,165,549 B2
(45) Date of Patent: *Dec. 10, 2024

(54) ELECTRONIC DEVICE

(71) Applicant: InnoLux Corporation, Miao-Li County (TW)

(72) Inventors: Yuan-Lin Wu, Miao-Li County (TW); Tsung-Han Tsai, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/412,606

(22) Filed: Jan. 15, 2024

(65) Prior Publication Data

US 2024/0153412 A1    May 9, 2024

Related U.S. Application Data

(63) Continuation of application No. 17/327,793, filed on May 24, 2021, now Pat. No. 11,908,350.

(30) Foreign Application Priority Data

Jun. 24, 2020  (CN) .......................... 202010587395.5

(51) Int. Cl.
*G09F 9/30* (2006.01)
*H01L 23/60* (2006.01)
*H04M 1/02* (2006.01)

(52) U.S. Cl.
CPC .............. *G09F 9/301* (2013.01); *H01L 23/60* (2013.01); *H04M 1/0268* (2013.01); *G09G 2330/04* (2013.01)

(58) Field of Classification Search
CPC .............. H10K 50/844; H10K 77/111; H10K 2102/311; H01L 23/60; G06F 1/1652; H04M 1/0268; H04M 1/0237; G09F 9/301; G09G 2330/04; Y02E 10/549
USPC .......................................................... 361/42
See application file for complete search history.

(56) References Cited

U.S. PATENT DOCUMENTS

| 2006/0068329 A1* | 3/2006 | Aylward ............... G02F 1/1333 430/311 |
| 2014/0043244 A1* | 2/2014 | van Lieshout ........ G06F 1/1616 345/173 |
| 2015/0077952 A1* | 3/2015 | Kim ....................... H10K 59/12 427/58 |
| 2019/0067218 A1* | 2/2019 | Lin ..................... H01L 27/0292 |

FOREIGN PATENT DOCUMENTS

EP    3 318 953 A1    5/2018

* cited by examiner

*Primary Examiner* — Kevin J Comber
(74) *Attorney, Agent, or Firm* — Winston Hsu

(57) ABSTRACT

An electronic device includes a rollable panel and a metal layer. The rollable panel includes a first portion and a second portion. The rollable panel has a first side and a second side opposite to the first side. The rollable panel includes a substrate, a circuit layer disposed on the substrate and a cover layer disposed on the circuit layer. The metal layer is disposed on one of the first side and the second side of the rollable panel and outside the rollable panel. In a rolled mode, at least a part of the metal layer is positioned between the first portion and the second portion of the rollable panel.

14 Claims, 15 Drawing Sheets

ELECTRONIC DEVICE

CROSS REFERENCE TO RELATED APPLICATIONS

This application is a continuation application of U.S. application Ser. No. 17/327,793, filed on May 24, 2021. The content of the application is incorporated herein by reference.

BACKGROUND OF THE DISCLOSURE

1. Field of the Disclosure

The present disclosure relates to an electronic device, and more particularly to a rollable electronic device having a discharger.

2. Description of the Prior Art

Recently, rollable display devices have become one of the development focuses in the field of display devices. However, static electricity may be generated in normal rollable display devices due to the friction between layers when the devices is being rolled, such that the probability of damage to the components in the display device may be increased due to the phenomenon of electrostatic discharge. Therefore, to reduce the static electricity in the components in the rollable display device so as to reduce the probability of damage to the components in the display device is still an important issue.

SUMMARY OF THE DISCLOSURE

In some embodiments, an electronic device is provided by the present disclosure. The electronic device includes a rollable panel and a metal layer. The rollable panel includes a first portion and a second portion. The rollable panel has a first side and a second side opposite to the first side. The rollable panel includes a substrate, a circuit layer disposed on the substrate and a cover layer disposed on the circuit layer. The metal layer is disposed on one of the first side and the second side of the rollable panel and outside the rollable panel. In a rolled mode, at least a part of the metal layer is positioned between the first portion and the second portion of the rollable panel.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the electronic device, and certain elements in various drawings may not be drawn to scale. In addition, the number and dimension of each element shown in drawings are only illustrative and are not intended to limit the scope of the present disclosure.

Certain terms are used throughout the description and following claims to refer to particular elements. As one skilled in the art will understand, electronic equipment manufacturers may refer to an element by different names. This document does not intend to distinguish between elements that differ in name but not function.

In the following description and in the claims, the terms "include", "comprise" and "have" are used in an open-ended fashion, and thus should be interpreted to mean "include, but not limited to . . . ".

It will be understood that when an element or layer is referred to as being "disposed on" or "connected to" another element or layer, it can be directly on or directly connected to the other element or layer, or intervening elements or layers may be presented (indirectly). In contrast, when an element is referred to as being "directly on" or "directly connected to" another element or layer, there are no intervening elements or layers presented.

The terms "approximately", "equal to", "equal" or "the same", "substantially" or "approximately" are generally interpreted as being within ±20% of the given value, or interpreted as being within ±10%, ±5%, ±3%, ±2%, ±1% or ±0.5% of the given value.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present disclosure.

Figure 1:
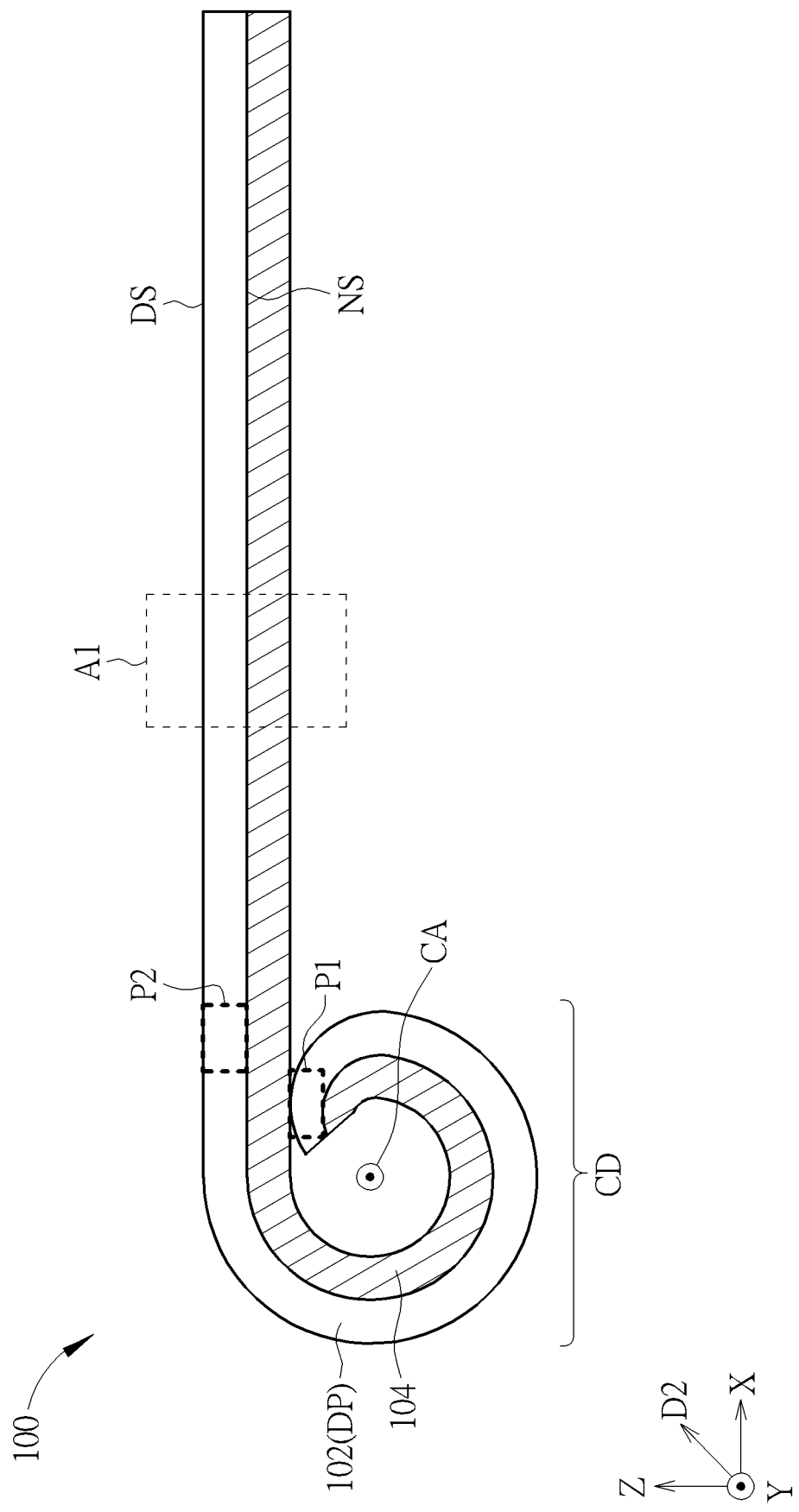
FIG. 1 schematically illustrates a cross-sectional view of a display device according to a first embodiment of the present disclosure.
Figure 2:
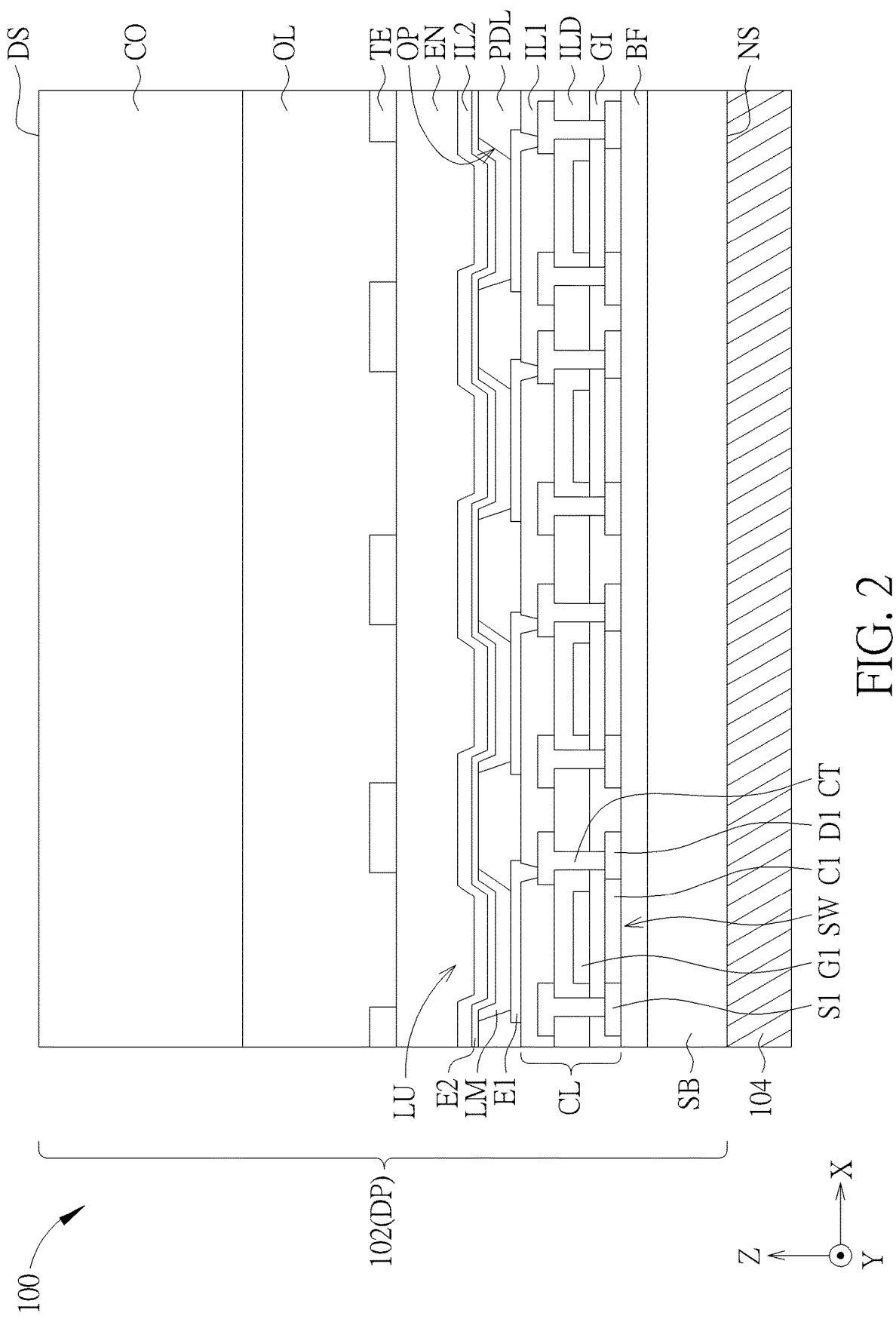
FIG. 2 schematically illustrates a partial enlarged view of a portion A1 shown in FIG. 1.

Referring to FIG. 1 and FIG. 2, FIG. 1 schematically illustrates a cross-sectional view of a display device according to a first embodiment of the present disclosure, and FIG. 2 schematically illustrates a partial enlarged view of a portion A1 shown in FIG. 1. According to the present embodiment, the electronic device shown in FIG. 1 may include a display device 100 that can display static or dynamic images or screens according to the demands and operations of users, but not limited thereto. The display device 100 may for example be applied to laptops, common displays, tiled displays, vehicle displays, touch displays, television, surveillance cameras, smart phones, tablets, light source modules, light emitting devices or electronic devices of the above-mentioned products, but not limited thereto. As shown in FIG. 1, the display device 100 may include a display panel DP, wherein the display panel DP of the present embodiment may for example include a rollable display panel or a screen-extendable display panel, but not limited thereto. The rollable display panel 102 is taken as an example of the display panel DP in the below-mentioned embodiments and variant embodiments for illustration, but the present disclosure is not limited thereto. As shown in FIG. 1, the rollable display panel 102 may include a displaying side DS and a non-displaying side NS, and the non-displaying side NS is opposite to the displaying side DS. The displaying side DS of the rollable display panel 102 may for example be the side of the rollable display panel 102 for displaying images, and the non-displaying side NS of the rollable display panel 102 may be another side of the rollable display panel 102 that does not display images and located at the rear side of the displaying side DS, but not limited thereto. The structure of the rollable display panel 102 will be detailed in the following.

As shown in FIG. 2, the rollable display panel 102 of the present embodiment may for example include a substrate SB, a circuit layer CL and a plurality of light emitting units LU. According to the present embodiment, the substrate SB may include glass, plastic, metal or the combinations of the above-mentioned materials. The substrate SB may include a flexible substrate, a rigid substrate or the combinations of the above-mentioned substrates. The material of the flexible substrate may for example include polyimide (PI), polycarbonate (PC), polyethylene terephthalate (PET), other suitable materials or the combinations of the above-mentioned materials. The substrate SB may be a single layer structure or a multi-layer structure, but not limited thereto. For example, the substrate SB may include a polyimide plate, a polyethylene terephthalate plate and a stainless steel plate, but not limited thereto. The plural light emitting units LU may be disposed on the substrate SB, wherein the light emitting units LU of the present embodiment may for example include organic light emitting diode (OLED), quantum light-emitting diode (QLED or QDLED), light emitting diode (LED), other suitable light emitting elements or the combinations of the above-mentioned light emitting elements. The light emitting diode may for example include mini light emitting diode (mini LED) or micro light emitting diode (micro LED), but not limited thereto. In an embodiment, the chip size of the mini light emitting diode may range from about 100 micrometers (μm) to about 300 micrometers, and the chip size of the micro light emitting diode may range from about 1 micrometer to about 100 micrometers, but not limited thereto.

For example, as shown in FIG. 2, the light emitting units LU of the present embodiment may for example be organic light emitting diodes and include a first electrode E1, a second electrode E2 and a light emitting layer LM, wherein the light emitting layer LM is disposed between the first electrode E1 and the second electrode E2, but not limited thereto. According to the present embodiment, the light emitting units LU (organic light emitting diodes) may for example include blue light emitting diodes, red light emitting diodes, green light emitting diodes, white light emitting diodes and/or light emitting diodes of other suitable colors, but not limited thereto. The first electrode E1 and the second electrode E2 may respectively serve as the cathode and the anode of the light emitting unit LU, but not limited thereto. In some embodiments, the first electrode E1 and the second electrode E2 may respectively serve as the anode and the cathode of the light emitting unit LU. The first electrode E1 and the second electrode E2 may for example include metal oxides, metal materials, other suitable conductive materials or the combinations of the above-mentioned materials, but not limited thereto. For example, the first electrode E1 and the second electrode E2 may include transparent conductive materials such as indium tin oxide (ITO), but not limited thereto. The circuit layer CL is disposed on the substrate SB, for example, the circuit layer CL is disposed between the substrate SB and the light emitting units LU. The circuit layer CL may include various kinds of wires, circuits and/or electronic components. For example, as shown in FIG. 2, the circuit layer CL may include a plurality of driving elements SW. Taking a driving element SW as an example, the driving element SW may for example include a thin film transistor (TFT), but the present disclosure is not limited thereto. The driving elements SW may include a gate G1, a source S1, a drain D1, a semiconductor layer C1 and a gate insulating layer GI, wherein the gate insulating layer GI may be located between the gate G1 and the semiconductor layer C1, but not limited thereto. The material of the semiconductor layer C1 may for example include amorphous semiconductor, polycrystalline semiconductor, metal oxides (such as indium gallium zinc oxide (IGZO)), other suitable materials or the combinations of the above-mentioned materials, but not limited thereto. The gate G1, the source S1 and the drain D1 may for example include metal materials, other suitable conductive materials or the combinations of the above-mentioned materials, but not limited thereto. The gate insulating layer GI may for example include silicon nitride, silicon oxide, other suitable insulating materials or the combinations of the above-mentioned materials, but not limited thereto. According to the present embodiment, at least one element of the circuit layer CL may be electrically connected to at least one light emitting unit LU. For example, the drain D1 of the driving element SW of the circuit layer CL may for example be electrically connected to the first electrode E1 of the light emitting unit LU through the contact CT. According to some embodiments, one of the driving elements SW may be electrically connected to one of the light emitting units LU. The source S1 of the driving element SW may be electrically connected to working voltage source (VDD) or common voltage source (not shown in FIG. 2), and the gate G1 of the driving element SW may for example be electrically connected to a switch element (not shown in FIG. 2), wherein the switch element may for example be a thin film transistor, but not limited thereto. In addition, although the driving element SW shown in FIG. 2 is a top-gate type thin film transistor, the present disclosure is not limited thereto. In some embodiments, the driving element SW may for example include a bottom-gate type thin film transistor or a multi-gate type thin film transistor (such as a dual gate thin film transistor). It should be noted that the numbers of the light emitting units LU and the driving elements SW are exemplary, and the present disclosure is not limited thereto.

In some embodiments, the rollable display panel 102 may further include a pixel defining layer PDL disposed between the light emitting layers LM, wherein the pixel defining layer PDL may include at least one opening OP, and the light emitting layer LM of the light emitting unit LU may be disposed in the opening OP. In some embodiments, because the light emitting layer LM is disposed in the opening OP, the opening OP of the pixel defining layer PDL may define the light emitting region or light emitting area of each of the light emitting units LU, but not limited thereto.

In some embodiments, the rollable display panel 102 may further include a buffer layer BF, an optical layer OL and a cover layer CO, but not limited thereto. The buffer layer BL is disposed between the substrate SB and the circuit layer CL, and the buffer layer BL may for example include any suitable buffer material. The optical layer OL may be optionally disposed in the rollable display panel 102, wherein the optical layer OL may for example include a polarizer, but not limited thereto. The cover layer CO may serve for protecting the layers or elements of the rollable display panel 102, wherein the cover layer CO may include glass, plastic, polymer, other suitable protecting materials or the combinations of the above-mentioned materials, but not limited thereto. In addition, the rollable display panel 102 may further include a touch layer TE in some embodiments, wherein the touch layer TE may include touch electrodes to provide the touch function of the rollable display panel 102, but not limited thereto. In some embodiments, the rollable display panel 102 may further include an interlayer dielectric layer ILD disposed on the gate insulating layer GI, an insulating layer IL1 disposed between the circuit layer CL and the light emitting units LU, an insulating layer IL2 disposed on the second electrode E2 and an insulating layer EN disposed on the insulating layer IL, but not limited thereto. The insulating layer IL1 and the insulating layer IL2 may for example include inorganic insulating materials, organic insulating materials or the combinations of the above-mentioned materials such as silicon oxide, silicon nitride, silicon oxynitride or other suitable materials, but not limited thereto. The insulating layer EN may be disposed on the light emitting units LU to protect the light emitting units LU, wherein the insulating layer EN may include any suitable insulating material such as organic insulating materials, inorganic insulating materials or the combinations of the above-mentioned materials. In some embodiments, the insulating layer EN may be an encapsulation layer disposed on the light emitting units LU and covering the light emitting units LU and the layers below the light emitting units LU.

In some embodiments, the insulating layer EN may include a three-layer structure of an inorganic layer, an organic layer and an inorganic layer.

Referring to FIG. 1 again, as well as FIG. 2, the display device 100 may further include a discharger 104 in addition to the above-mentioned rollable display panel 102 in the present embodiment, as shown in FIG. 1, wherein the discharger 104 may for example be disposed on one of the displaying side DS and the non-displaying side NS of the rollable display panel 102. The discharger 104 may be an object capable of conducting electric charges. According to some embodiments, the discharger 104 may be disposed on the displaying side DS and the non-displaying side NS at the same time. In detail, as shown in FIG. 1, the discharger 104 may for example be disposed on the non-displaying side NS of the rollable display panel 102, but not limited thereto. The discharger 104 may be disposed on the surface of the non-displaying side NS of the rollable display panel 102 directly or indirectly. For example, as shown in FIG. 1 and FIG. 2, the discharger 104 of the display device 100 may be directly disposed on the non-displaying side NS of the rollable display panel 102 and in contact with the non-displaying side NS, but not limited thereto. In some embodiments, the discharger 104 may be directly disposed on the rollable display panel 102 through sputtering or deposition, but the present disclosure is not limited thereto. In addition, although the outer edge of the discharger 104 is substantially aligned with the outer edge of the rollable display panel 102 in the display device 100 shown in FIG. 1, the present disclosure is not limited thereto. The outer edge of the discharger 104 may be protruded from the outer edge of the rollable display panel 102, or, the discharger 104 may have an outer edge that is more retracted than the outer edge of the rollable display panel 102.

It should be noted that although the discharger 104 shown in FIG. 2 is directly formed on the surface of the non-displaying side NS of the rollable display panel 102, the present disclosure is not limited thereto. In some embodiments, the display device 100 may further include a conductive material (not shown), wherein the discharger 104 may be disposed on the non-displaying side NS of the rollable display panel 102 through the conductive material, but not limited thereto. In detail, the conductive material may be a conductive glue, and the discharger 104 may be adhered to the substrate SB of the rollable display panel 102 through the conductive glue, but not limited thereto. That is, the discharger 104 of the present embodiment may be formed on the displaying side DS and/or the non-displaying side NS of the rollable display panel 102 indirectly.

According to some embodiments, the discharger 104 may include any object capable of conducting electric charges. For example, the discharger 104 may include a conductive layer, wherein the electrical conductivity of the conductive layer may range from $10^4$ to $10^8$ ohm$^{-1}$*m$^{-1}$, but not limited thereto. The upper limit and the lower limit in the above-mentioned range are also included in the conductivity range of the conductive layer (that is, $10^4$ ohm$^{-1}$*m$^{-1}$ electrical conductivity $10^8$ ohm$^{-1}$*m$^{-1}$). In detail, the material of the discharger 104 of the present embodiment may for example include copper, silver, aluminum, gold, zinc, iron, tin, graphite, other suitable materials or the combinations of the above-mentioned materials, but not limited thereto. According to some embodiments, the discharger 104 may include a multi-layer structure. For example, the discharger 104 may include the multi-layer structure formed of the above-mentioned materials, wherein the "multi-layer" represents at least two layers. In some embodiments, when the material of the discharger 104 includes graphite, the discharger 104 may be directly formed on the rollable display panel 102 through coating, but not limited thereto.

The electrical conductivity is a measured value showing the ability of a substance to transmit current, and the electrical conductivity is the inverse of the electrical resistivity. In International System of Units, the unit of the electrical conductivity is $S \cdot m^{-1}$ (siemens per meter) or $ohm^{-1} \cdot m^{-1}$. In some embodiments, the electrical conductivity of the discharger 104 may for example be measured by using a probe to contact the discharger 104, but not limited thereto. For example, the electrical conductivity may be measured by an electrical conductivity instrument or an electrical resistivity instrument. It should be noted that although the discharger 104 shown in FIG. 1 and FIG. 2 is a single layer structure, the present disclosure is not limited thereto. In some embodiments, the discharger 104 may for example include a multi-layer structure. When the discharger 104 is a multi-layer structure, the electrical conductivity of at least one layer of the multi-layer structure may range from $10^4$ to $10^8$ $ohm^{-1}*m^{-1}$, but not limited thereto. According to some embodiments, electrical conductivity instrument or electrical resistivity instrument can be adopted for directly measure the electrical conductivity of the discharger 104 of the rollable display device when the electrical conductivity is needed to be determined. Alternatively, the component (or element) of the discharger 104 can be analyzed at first, and then the electrical conductivity corresponding to the component (or element) can be found from the electrical conductivity table. When the discharger 104 includes a plurality of components (or elements), the electrical conductivity of at least one component (or element) of the components (or elements) may range from $10^4$ to $10^8$ $ohm^{-1}*m^{-1}$. The material, structure, range of the electrical conductivity, disposition methods and measurement methods of the electrical conductivity of the discharger 104 of the present embodiment may be applied to the below-mentioned embodiments and variant embodiments of the present disclosure, and will not be redundantly described later.

In conventional rollable display devices, because the friction may occur between the layers of the display devices when the display devices are folded and/or unfolded, static electricity may be generated in the rubbed layers, thereby causing electrostatic discharge (ESD), such that the possibility of damage of the elements or layers of the display devices may be increased. For example, when the conventional rollable display devices are folded and/or unfolded, friction may occur between the cover layer (such as the cover layer CO shown in FIG. 2) of the rollable display panel and the substrate (such as the substrate SB shown in FIG. 2) of the rollable display panel, and static electricity may be generated. According to the present embodiment, when the rollable display device is folded, it can also be called as being rolled.

According to the present embodiment, as shown in FIG. 1, the rollable display panel 102 may be rolled or unfolded. Specifically, the rollable display panel 102 can be rolled based on a virtual or substantial axis CA. For example, the display device 100 may include a scroll bar element (not shown), and the rollable display panel 102 may be rolled based on the substantial axis CA of the scroll bar element. The discharger 104 may be disposed on the non-displaying side NS of the rollable display panel 102. When the rollable display panel 102 is rolled, the rollable display panel 102 may include an overlapping portion in a radiation direction D2 of the axis CA because it is rolled. For example, the rollable display panel 102 may include a first portion P1 and a second portion P2, and the first portion P1 may be overlapped with the second portion P2 when the rolled display panel 102 is being rolled. Specifically, in the overlapping portion, the portion in the inner circle may be defined as the first portion P1, and the portion in the outer circle may be defined as the second portion P2, but not limited thereto. As shown in FIG. 1, when the rollable display panel 102 is rolled and the first portion P1 and the second portion P2 move close to each other, the discharger 104 is located between the first portion P1 and the second portion P2.

According to the present embodiment, when the display device 100 is being rolled, because the discharger 104 is disposed between the first portion P1 and the second portion P2 of the rollable display panel 102, the first portion P1 may not be in contact with the second portion P2, and the possibility of friction between the first portion P1 and the second portion P2 may be reduced. In addition, because the discharger 104 of the present embodiment includes conductive layer, the contact or friction between the first portion P1 and the discharger 104 may form a static electricity release path, thereby reducing the amount of static electricity in the first portion P1 and the second portion P2. That is, because the display device 100 of the present embodiment includes the discharger 104, the static electricity generated when the rollable display panel 102 is being rolled may be reduced, thereby improving the yield of the display device 100. The definitions of the first portion P1 and the second portion P2 and the relation between the discharger 104, the first portion P1 and the second portion P2 when the rollable display panel 102 is being rolled mentioned in the present embodiment may be applied to each of the embodiments and variant embodiments of the present disclosure. Although some figures corresponding to the following embodiments do not directly mark the first portion P1 and the second portion P2, the positions of the first portion P1 and the second portion P2 of the present disclosure in those figures can be defined without doubt according to the definitions mentioned in the related descriptions of the first embodiment and FIG. 1, and will not be redundantly described later.

In addition, the rolling rate of the rollable display panel 102 of the display device 100 may affect the amount of accumulated static electricity. When the rolling rate of the rollable display panel 102 is greater, the friction speed between the layers will be greater, the amount of the generated static electricity may be greater, and the possibility of electrostatic discharge (ESD) may be increased. Therefore, the accumulation of static electricity may be reduced by controlling the rolling rate of the rollable display panel 102 of the display device 100 in the present embodiment. In detail, the rolling rate of the rollable display panel 102 may for example be lower than or equal to 0.1 meter per second (m/s) in the present embodiment to reduce the amount of static electricity, but not limited thereto. The range of the rolling rate of the rollable display panel 102 mentioned above may be applied to each of the embodiments and variant embodiments of the present disclosure, and will not be redundantly described later.

Other embodiments of the present disclosure will be described in the following. In order to simplify the description, the same elements or layers mentioned above would be labeled with the same symbol in the following embodiments, and the features thereof will not be redundantly described. In addition, the differences between each of the embodiments will be described in detail in the following contents.

Figure 3:
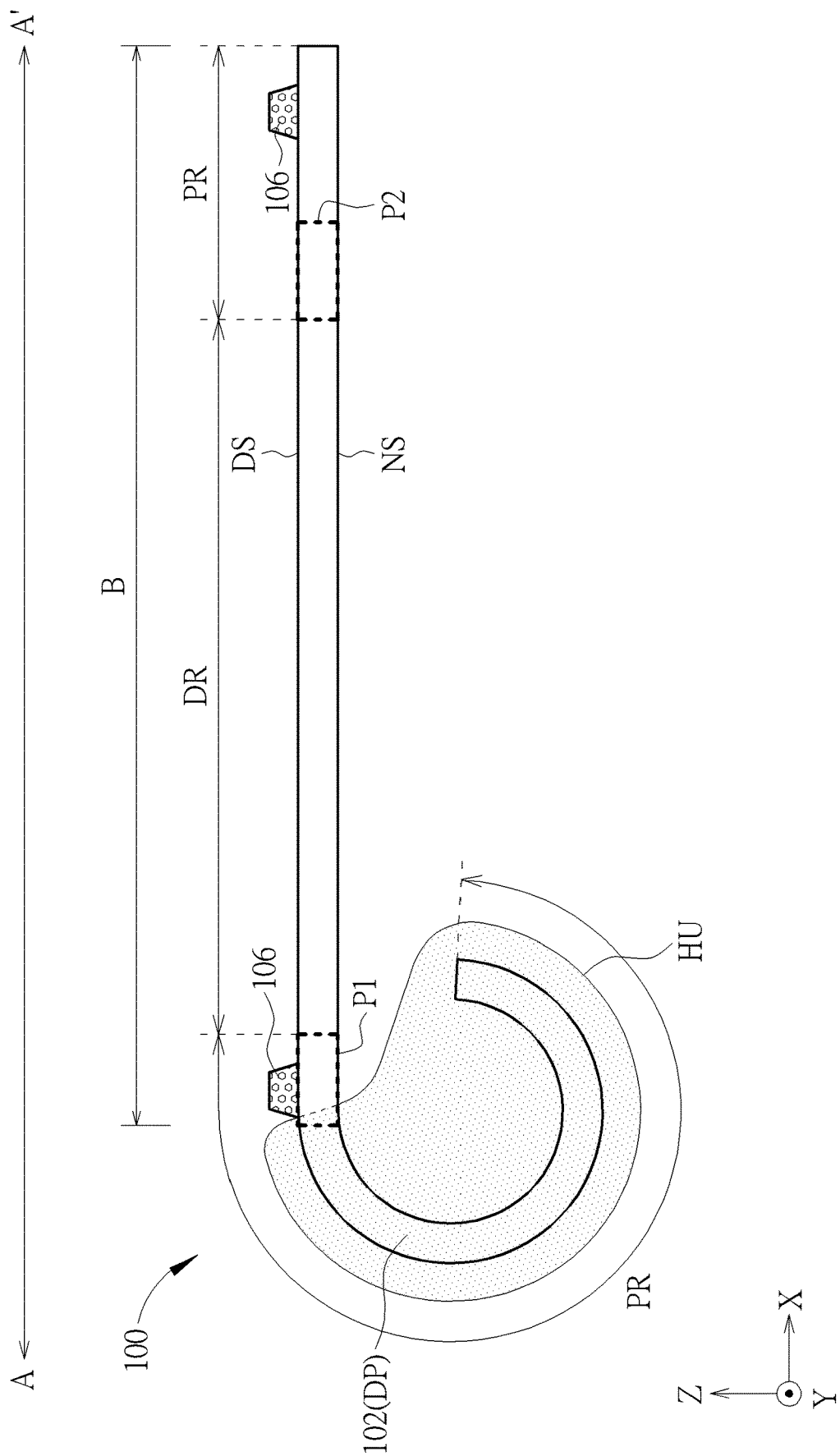
FIG. 3 schematically illustrates a cross-sectional view of a display device according to a second embodiment of the present disclosure.
Figure 4:
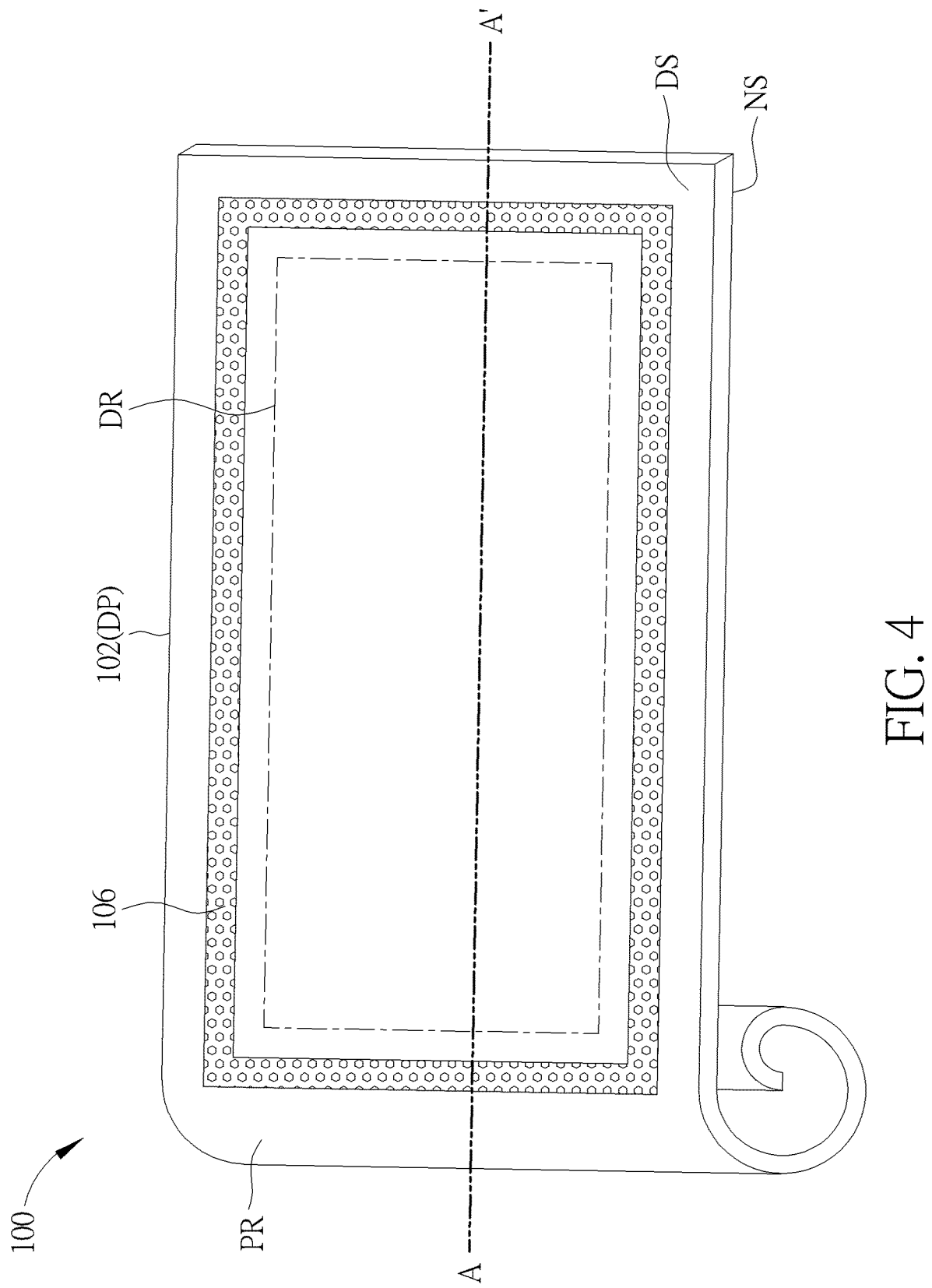
FIG. 4 schematically illustrates a top view of the display device according to the second embodiment of the present disclosure.

Referring to FIG. 3 and FIG. 4, FIG. 4 schematically illustrates a top view of the display device according to a second embodiment of the present disclosure, and FIG. 3 schematically illustrates a cross-sectional view of the structure shown in FIG. 4 along a cut line A-A'. In order to simplify the figure, the rollable display panels 102 in FIG. 3 and the following figures are exemplarily shown as a single layer structure, and the elements and the layers included in the rollable display panel 102 may refer to the structure shown in FIG. 2 and the related descriptions mentioned above, which will not be redundantly described. According to the present embodiment, as shown in FIG. 3, the display device 100 may include a discharger 106 disposed on the displaying side DS, but not limited thereto. As shown in FIG. 3, at least a portion of the display device 100 is not rolled, for example, the portion of the display device 100 located in the region B is not rolled. As shown in FIG. 3, the rollable display panel 102 may include the first portion P1 and the second portion P2 in the present embodiment. When the rollable display panel 102 shown in FIG. 3 is being rolled, the first portion P1 and the second portion P2 may move close to each other, and in the meanwhile, the discharger 106 may be located between the first portion P1 and the second portion P2. Specifically, when the rollable display panel 102 shown in FIG. 3 is being rolled and the first portion P1 and the second portion P2 are moving close to each other, the first portion P1 and the second portion P2 may be overlapped with each other in the radiation direction of the axis, and the discharger 106 may be located between the first portion P1 and the second portion P2. According to the design mentioned in the present embodiment, the friction between the first portion P1 and the second portion P2 may be reduced, thereby reducing the electrostatic discharge of the display device. According to the present embodiment, the discharger 106 may include any suitable conductive material. For example, the discharger 106 may for example include silver glue, anisotropic conductive film (ACF), other suitable conductive materials or the combinations of the above-mentioned materials, but not limited thereto.

According to the present embodiment, as shown in FIG. 3, the rollable display panel 102 of the display device 100 may include a display region DR and a peripheral region PR. The display region DR may for example be defined by the distribution area of the pixels of the rollable display panel 102. In detail, each of the pixels or sub-pixels (referred to as pixels hereinafter) of the rollable display panel 102 may for example be defined through the pixel defining layer PDL shown in FIG. 2, wherein each of the pixels may for example correspond to a light emitting unit LU and the driving element SW and other related elements corresponding to the light emitting unit LU, but not limited thereto. According to the present embodiment, the display region DR may for example be defined as the region enclosed by the outer edge of the outermost pixels of the plurality of pixels, but not limited thereto. In addition, the region of the rollable display panel 102 other than the display region DR may be defined as the peripheral region PR, but not limited thereto. That is, the display region DR may for example correspond to the region where the rollable display panel 102 displays image, and the peripheral region PR may for example correspond to the disposition position of the peripheral elements of the rollable display panel 102 which may not display image, but not limited thereto. In some embodiments, the rollable display panel 102 may include the display region DR and not include the peripheral region PR, but not limited thereto. The definitions of the display region DR and the peripheral region PR may be applied to each of the embodiments and variant embodiments of the present disclosure, and will not be redundantly described later. It should be noted that the range or size of the display region DR and the range or size of the peripheral region PR shown in FIG. 3 are exemplary, which do not represent the real ranges or sizes of the display region DR and the peripheral region PR of the rollable display device 102.

According to the present embodiment, the discharger 106 may be disposed corresponding to the peripheral region PR of the rollable display panel 102. For example, as shown in FIG. 4, the rollable display panel 102 includes the display region DR and the peripheral region PR located outside of the display region DR, wherein the discharger 106 may be disposed in the peripheral region PR in a frame shape along the periphery of the display region DR, but not limited thereto. It should be noted that FIG. 3 and FIG. 4 just exemplarily show the structure that the discharger 106 is disposed corresponding to the peripheral region PR, and the ranges of the display region DR and the peripheral regions PR of the rollable display panel 102 are not limited to what is shown in FIG. 3 and FIG. 4. Because the discharger 106 may be disposed in the peripheral region PR in the present embodiment, the effect of the discharger 106 on the display function of the rollable display panel 102 may be reduced. In some embodiments, the discharger 106 may be disposed in any shape on the displaying side DS of the rollable display panel 102 as long as it does not affect the display function of the rollable display panel 102. For example, when the display region DR of the rollable display panel 102 is a rectangle, the discharger 106 may for example be disposed corresponding to the four corners of the display region DR in the peripheral region PR, but not limited thereto. The discharger 106 may be disposed on the displaying side DS of the rollable display panel 102 in any shape (such as frame, ring, dot or irregular shape). The design of the discharger of the present embodiment may be applied to each of the embodiments and variant embodiments of the present disclosure, and will not be redundantly describe later.

Referring to FIG. 3 again, the display device 100 of the present embodiment may further include a housing HU in addition to the above-mentioned elements or layers, wherein the housing HU can be used to house the rollable display panel 102 in the present embodiment, but not limited thereto. In detail, as shown in FIG. 3, the structure shown in FIG. 3 includes a portion of the rollable display panel which is unfolded and another portion of the rollable display panel which is housed in the housing HU, wherein when the user wants to end the use of the rollable display panel 102, the unfolded portion of the rollable display panel 102 can be housed into the housing HU by rolling, but not limited thereto. The housing HU may for example include the scroll bar element (not shown in FIG. 3) used in the display device 100, but not limited thereto. It should be noted that the shape and the position of the housing HU shown in FIG. 3 are exemplary, and do not represent the real shape and position of the housing HU of the present embodiment. In addition, in order to simplify the figure, the housing HU is omitted in FIG. 4, but not limited thereto. The feature that the display device 100 includes the housing HU mentioned in the present embodiment may be applied to each of the embodiments and variant embodiments of the present disclosure, and will not be redundantly described later.

Figure 5:
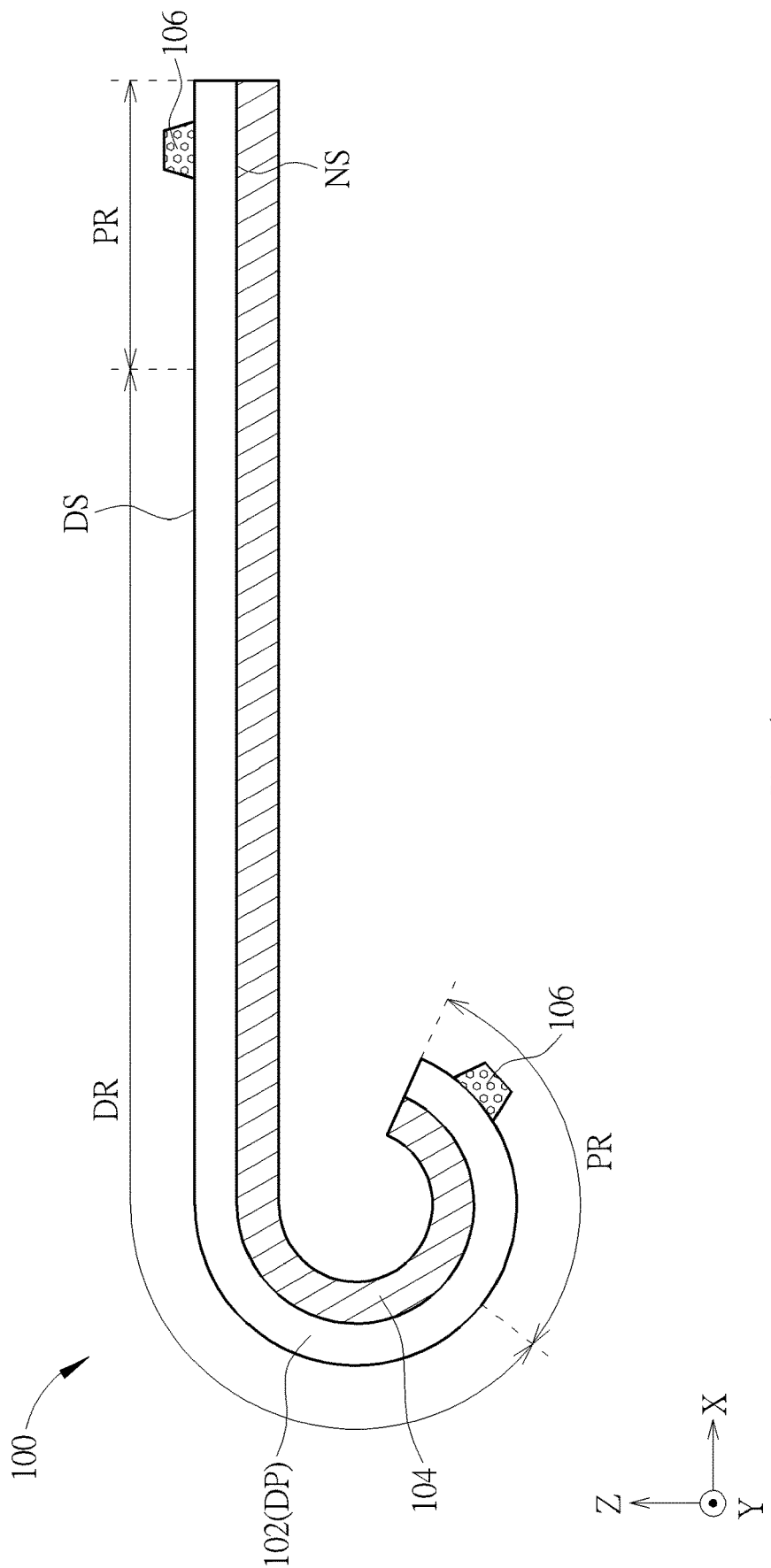
FIG. 5 schematically illustrates a cross-sectional view of a display device according to a third embodiment of the present disclosure.

Referring to FIG. 5, FIG. 5 schematically illustrates a cross-sectional view of a display device according to a third embodiment of the present disclosure. One of the main differences between the structure shown in FIG. 5 and the structure of the first embodiment shown in FIG. 1 is the design of the discharger. According to the present embodiment, as shown in FIG. 5, the display device 100 may further include the discharger 106 in addition to the discharger 104, wherein the discharger 106 may for example be disposed on the displaying side DS of the rollable display panel 102. That is, the display device 100 in the present embodiment may include the discharger 104 disposed on the non-displaying side NS of the rollable display panel 102 and the discharger 106 disposed on the displaying side DS, but not limited thereto. The materials of the discharger 104 and the discharger 106 may refer to the materials in the above-mentioned first embodiment and second embodiment, and will not be redundantly described here. In addition, as shown in FIG. 5, the discharger 106 may be disposed corresponding to the peripheral region PR in the present embodiment. In detail, the discharger 106 may be disposed on the displaying side DS of the rollable display panel 102 corresponding to the peripheral region PR, but not limited thereto. The disposition position and the effect of reducing static electricity in the discharger 104 and the discharger 106 may refer to the description in the above-mentioned first embodiment and second embodiment, and will not be redundantly described here.

Figure 6:
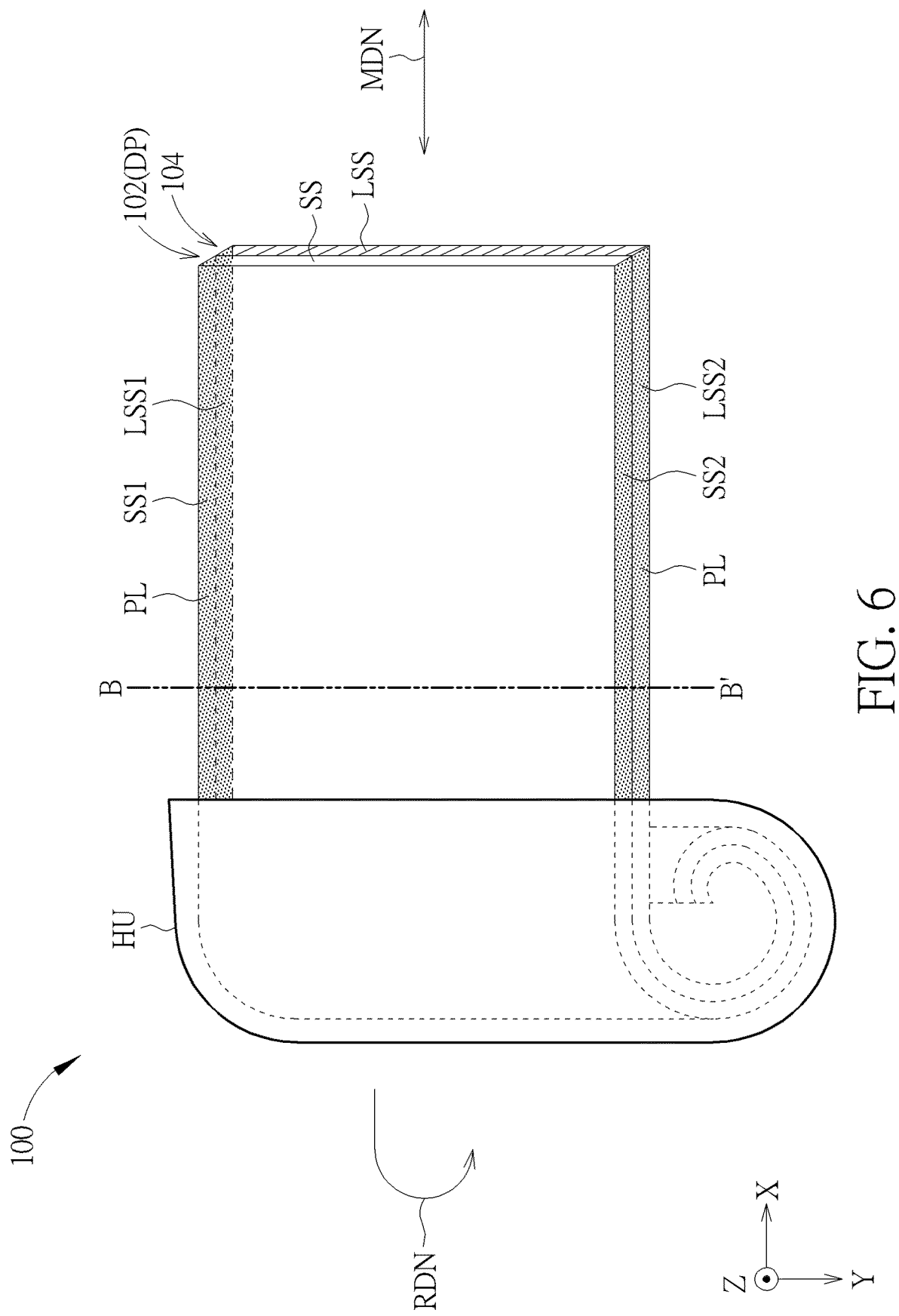
FIG. 6 schematically illustrates a top view of a display device according to a fourth embodiment of the present disclosure.
Figure 7:
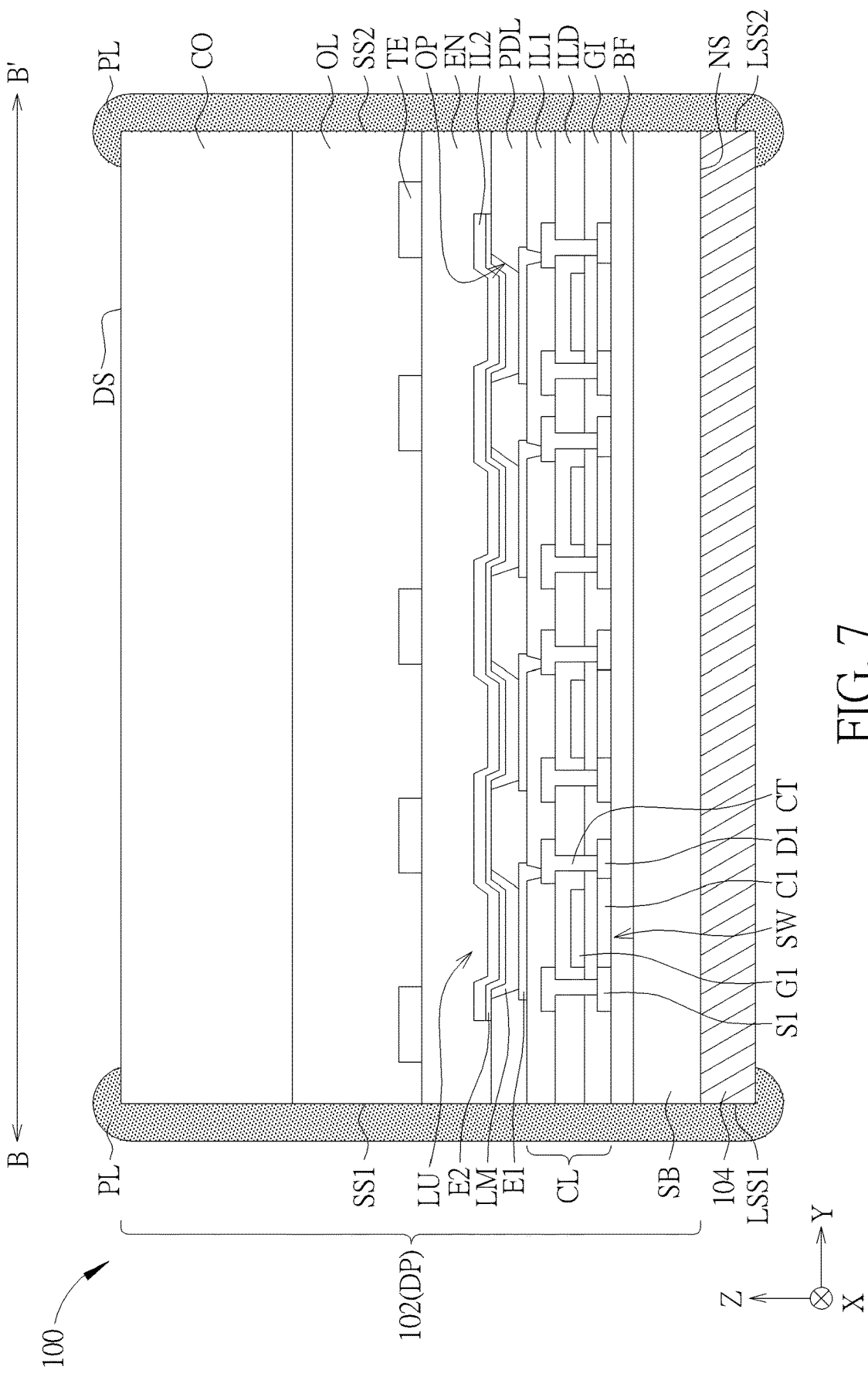
FIG. 7 schematically illustrates a cross-sectional view of the display device according to the fourth embodiment of the present disclosure.

Referring to FIG. 6 and FIG. 7, FIG. 6 schematically illustrates a top view of a display device according to a fourth embodiment of the present disclosure, and FIG. 7 schematically illustrates a cross-sectional view of the structure shown in FIG. 6 along the cut line B-B'. It should be noted that the shape of the housing HU shown in FIG. 6 is exemplary, and does not represent the real shape or disposition position of the housing HU of the present embodiment. One of the main differences between the structure shown in FIG. 6 and the structure of the first embodiment shown in FIG. 1 is the design of the discharger. As shown in FIG. 6, the display device 100 may further include a protecting layer PL in addition to the discharger 104 disposed on the non-displaying side NS of the rollable display panel 102 in the present embodiment, wherein the protecting layer PL is disposed on the side surface of the rollable display panel and the side surface of the discharger 104. In detail, the rollable display panel 102 may include a plurality of side surfaces (such as the side surface SS, the side surface SS1 and the side surface SS2 shown in FIG. 6 and FIG. 7) in the direction Z (or the thickness direction of the rollable display panel 102), and the discharger 104 may include a plurality of side surfaces (such as the side surface LSS, the side surface LSS1 and the side surface LSS2 shown in FIG. 6 and FIG. 7) in the direction Z, wherein the protecting layer PL may for example de disposed on the side surfaces of the rollable display panel 102 and the side surfaces of the discharger 104 which are parallel to the rolling direction RDN or the rolling-moving direction MDN of the rollable display panel 102, and the protecting layer PL may cover the above-mentioned side surfaces. In detail, as shown in FIG. 6, the rolling direction RDN or the rolling-moving direction MDN (or the folded/unfolded direction) of the rollable display panel 102 may for example be parallel to the direction X, wherein the side surface SS1 and the side surface SS2 of the rollable display panel 102 and the side surface LSS1 and the side surface LSS2 of the discharger 104 may be parallel to the rolling-moving direction MDN. Therefore, the protecting layer PL may be disposed on the side surface SS1 and the side surface SS2 of the rollable display panel 102 and the side surface LSS1 and the side surface LSS2 of the discharger 104, and the protecting layer PL may cover these side surfaces, but not limited thereto. In the present embodiment, the protecting layer PL may include any protecting glue material with the electrical conductivity ranges from $10^3$ to $10^7$ $m^{-1}ohm^{-1}$ (that is, $10^3$ $ohm^{-1}*m^{-1}$ electrical conductivity $10^7$ $ohm^{-1}*m^{-1}$), but not limited thereto. In conventional rollable display panel, the friction between the side surfaces of the display panel and the housing may occur when the device is being rolled, such that the possibility of electrostatic discharge may be increased duo to the accumulation of static electricity. For example, as shown in FIG. 6, when the rollable display panel 102 of the display device 100 is being rolled, the two sides (such as the side surface SS1 and the side surface SS2) of the rollable display panel 102 perpendicular to the axis (not shown) may be in contact with the housing HU, and the friction may occur. However, according to the present embodiment, because the display device 100 may include the protecting layer PL disposed on the side surface SS1 and the side surface SS2, the possibility of friction between the side surface SS1 and/or the side surface SS2 and the housing HU may be reduced. In addition, because the protecting layer PL of the present embodiment may for example include conductive materials and may for example be electrically connected to the discharger 104 through the side surface LSS1 and the side surface LSS2 of the discharger 104, although the friction between the housing HU and the protecting layer PL may occur, a static electricity releasing path may be formed to reduce the accumulation of static electricity in the display device 100, thereby improving the yield of the display device 100.

As shown in FIG. 7, FIG. 7 schematically illustrates a cross-sectional view of the structure shown in FIG. 6 along the cut line B-B'. As mentioned above, the protecting layer PL may be disposed on the side surface SS1 and the side surface SS2 of the rollable display panel 102 and on the side surface LSS1 and the side surface LSS2 of the discharger 104 in the present embodiment, and the protecting layer PL may cover the side surface SS1 and the side surface SS2 of the rollable display panel 102 and the side surface LSS1 and the side surface LSS2 of the discharger 104, but not limited thereto. It should be noted that although FIG. 7 shows the structure that the protecting layer PL that partially covers the discharger 104 is formed after the discharger 104 is formed on the non-displaying side NS of the rollable display panel 102, the present disclosure is not limited thereto. In some embodiments, the discharger 104 may be formed after the protecting layer PL is formed. The disposition of the protecting layer mentioned in the present embodiment may be applied to each of the embodiments and variant embodiments of the present disclosure, and will not be redundantly described later.

Figure 8:
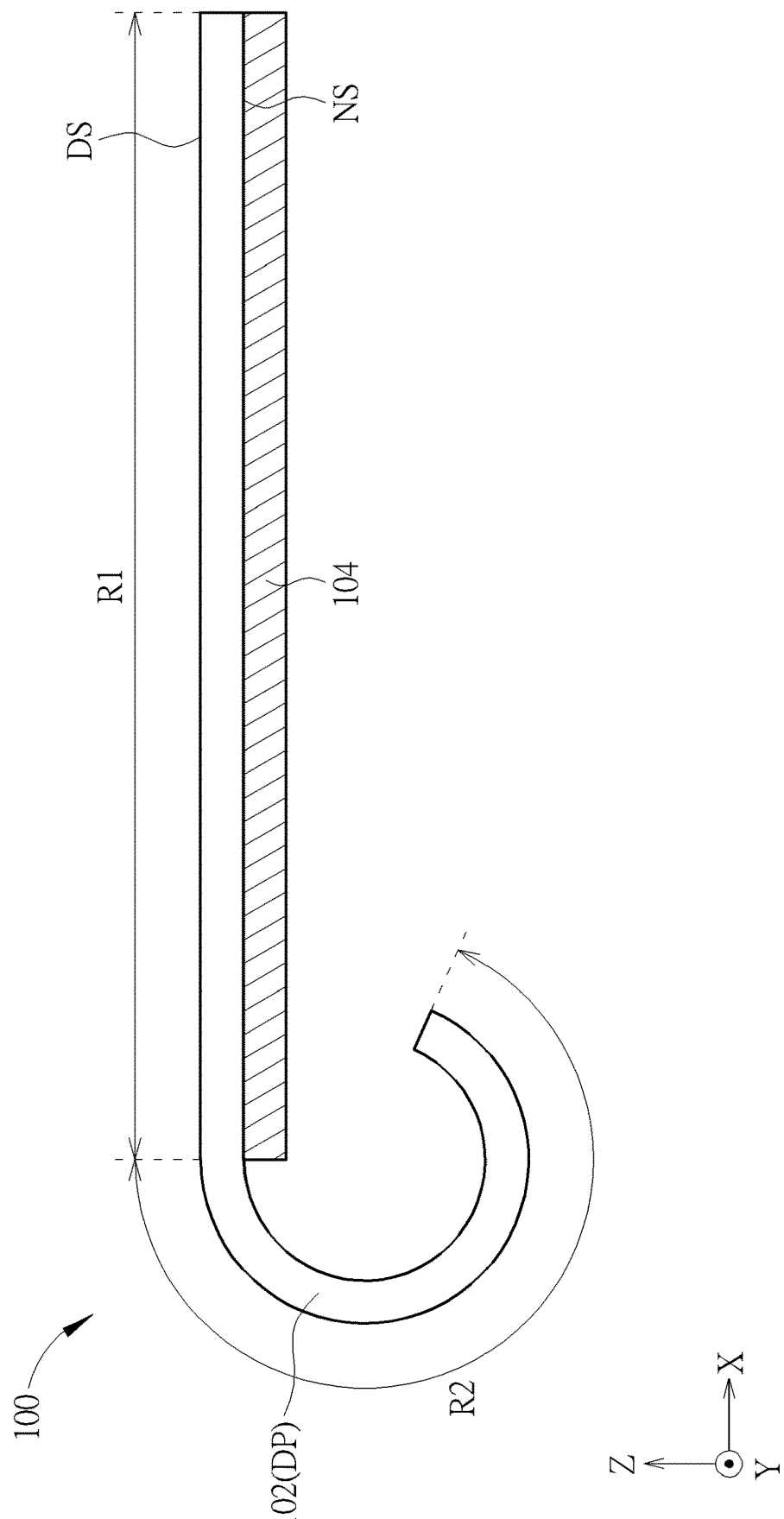
FIG. 8 schematically illustrates a cross-sectional view of a display device according to a fifth embodiment of the present disclosure.

Referring to FIG. 8, FIG. 8 schematically illustrates a cross-sectional view of a display device according to a fifth embodiment of the present disclosure. One of the main differences between the structure shown in FIG. 8 and the structure of the first embodiment shown in FIG. 1 is the design of the discharger. According to the present embodiment, as shown in FIG. 8, the display device 100 may include the rollable display panel 102 and the discharger 104 disposed on the non-displaying side NS of the rollable display panel 102, and compared to the structure shown in FIG. 1, the discharger 104 of the present embodiment may not be entirely disposed on the non-displaying side NS of the rollable display panel 102, but not limited thereto. In detail, as shown in FIG. 8, the non-displaying side NS of the rollable display panel 102 may be divided into a first region R1 and a second region R2, wherein the discharger 104 may for example be disposed on the non-displaying side NS of the rollable display panel 102 corresponding to the first region R1, and the second region R2 of the non-displaying side NS may not include the discharger 104, but not limited thereto. In some embodiments, when the user uses the display device 100, at least a portion of the rollable display panel 102 may be housed in the housing (not shown in FIG. 8), and the portion of the rollable display panel 102 may not leave the housing regardless of the rolling degree of the display device 100. In other words, even if the display device 100 is unfolded to the limit state or stretched out to maximize the display area, a portion of the rollable display panel 102 can still be housed in the housing and does not include the display function, wherein the portion of the rollable display panel 102 housed in the housing may for example be connected to an axis element (not shown in FIG. 8) in the housing to make the rollable display panel 102 be easily rolled and housed through the axis element in the housing, but not limited thereto. Form the contents mentioned above, it can be known that because a portion of the rollable display panel 102 may not move out of the housing due to the unfolding of the display device 100, when the rollable display panel 102 is being rolled, the possibility that the static electricity is generated in the portion of the rollable display panel 102 due to the friction can be reduced. That is, the discharger 104 of the display device 100 may not be disposed on the portion of the rollable display panel 102 in the present embodiment, thereby reducing the production cost of the display device 100. For example, as shown in FIG. 8, the portion of the rollable display panel 102 located in the first region R1 of FIG. 8 may for example be a portion of the rollable display panel 102 located outside of the housing and used to display images when the display device 100 is unfolded to the limit state, and the portion of the rollable display panel 102 located in the second region R2 of FIG. 8 may for example be another portion of the rollable display panel 102 normally housed in the housing. Therefore, according to the present embodiment, because the possibility of friction between the layers of the rollable display panel 102 located in the second region R2 is lower, and the possibility of friction between the layers of the rollable display panel 102 located in the first region R1 is greater, the discharger 104 may for example be disposed on the rollable display panel 102 corresponding to the first region R1, but not limited thereto. In addition, because the discharger 104 is not disposed on the rollable display panel 102 corresponding to the second region R2, the entire thickness of the display device 100 in the second region R2 may be reduced, such that the rollable display panel 102 may have lower radius of curvature after the rollable display panel 102 is rolled, thereby reducing the size of the display device 100. The disposition features of the discharger of the present embodiment may be applied to each of the embodiments and variant embodiments of the present disclosure, and will not be redundantly described later.

Figure 9:
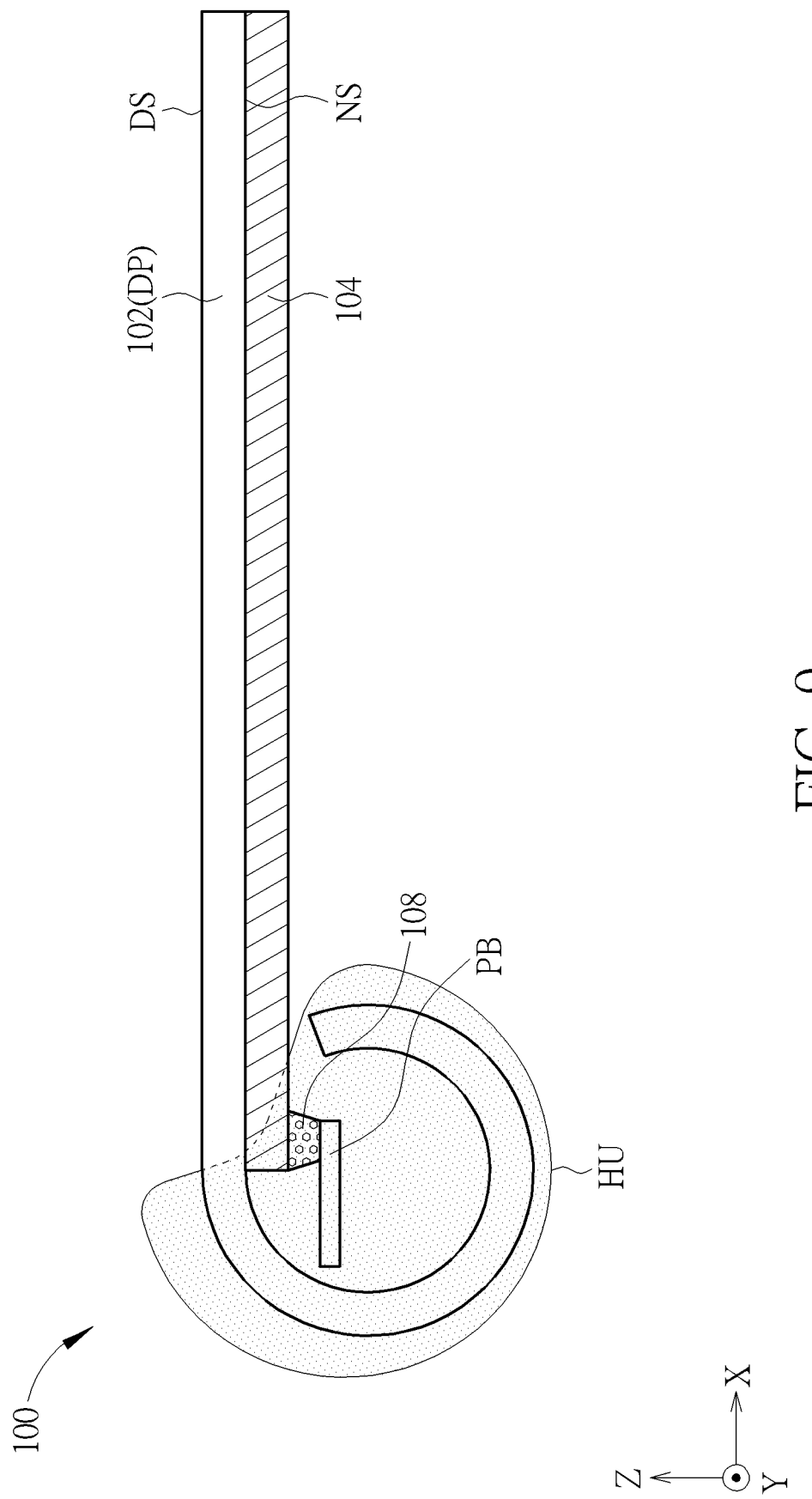
FIG. 9 schematically illustrates a cross-sectional view of a display device according to a sixth embodiment of the present disclosure.

Referring to FIG. 9, FIG. 9 schematically illustrates a cross-sectional view of a display device according to a sixth embodiment of the present disclosure. One of the main differences between the structure shown in FIG. 9 and the structure of the first embodiment shown in FIG. 1 is the design of the discharger. Compared to the first embodiment, the discharger 104 of the present embodiment may be grounded. For example, the discharger 104 may be a conductive layer, wherein the conductive layer may be electrically connected to a constant voltage. In detail, according to the present embodiment, the discharger 104 may be a conductive layer, wherein the conductive layer may be electrically connected to a common voltage node to be grounded. Therefore, the electric charge accumulated on the discharger 104 may be reduced. As shown in FIG. 9, the discharger 104 may be electrically connected to the common voltage node through a conductive connector 108, wherein the common voltage node may for example be disposed on the circuit board PB, or, the discharger 104 may be electrically connected to the constant level on the circuit board PB through the conductive connector 108, but not limited thereto. The conductive connector 108 may be a conductive glue or a solder. The conductive glue may be a silver glue or an anisotropic conductive adhesive, but not limited thereto. In some embodiments, the rollable display panel 102 may include common lines, the common lines may be electrically connected to the common voltage node on the circuit board PB, and the discharger 104 may be electrically connected to the common voltage node, but not limited thereto. In the present embodiment, the material of the conductive connector 108 may for example be the same as the material of the discharger 106 disposed on the displaying side DS in the above-mentioned second embodiment, and will not be redundantly described here. In addition, according to the present embodiment, as shown in FIG. 9, the conductive connector 108 and the circuit board PB including the common voltage node of the display device 100 may for example be disposed in the housing HU, but the present disclosure is not limited thereto. It should be noted that FIG. 9 just exemplary illustrates the structure of the present embodiment that the discharger 104 is electrically connected to the common voltage node on the circuit board PB, and the real disposition positions and the shapes of the conductive connector 108 and the circuit board PB are not limited to what is shown in FIG. 9. In addition, although the discharger 104 shown in FIG. 9 is partially disposed on the non-displaying side NS of the rollable display panel 102 (as mentioned in the description of the fifth embodiment above and shown in FIG. 8), the present embodiment is not limited thereto. In some embodiments, the discharger 104 may be entirely disposed on the non-displaying side NS of the rollable display panel 102 (as shown in FIG. 1), and the conductive connector 108 and the circuit board PB may be disposed in any suitable position in the housing HU and be electrically connected to the discharger 104, but not limited thereto. Because the discharger 104 of the present embodiment may be electrically connected to the common voltage node on the circuit board PB through the conductive connector 108, when the rollable display panel 102 is being rolled, the static electricity accumulated due to the friction may be discharged through the discharger 104, the conductive connector 108 and the circuit board PB, thereby reducing the possibility of electrostatic discharge in the display device 100. The design that the discharger 104 is electrically connected to the common voltage node may be applied to each of the embodiments and variant embodiments of the present disclosure, and will not be redundantly described later.

Figure 10:
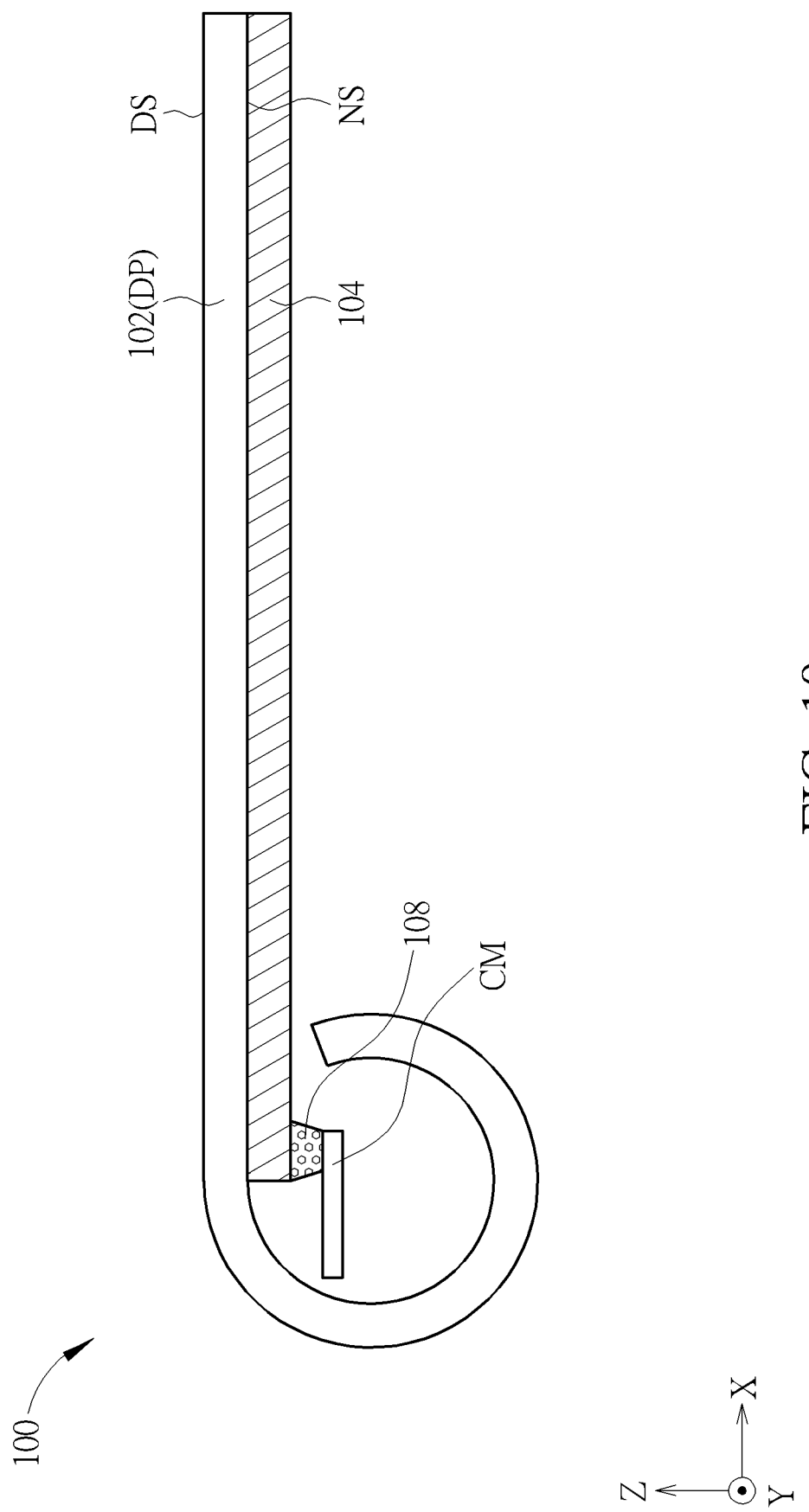
FIG. 10 schematically illustrates a cross-sectional view of a display device according to a variant embodiment of the sixth embodiment of the present disclosure.
Figure 11:
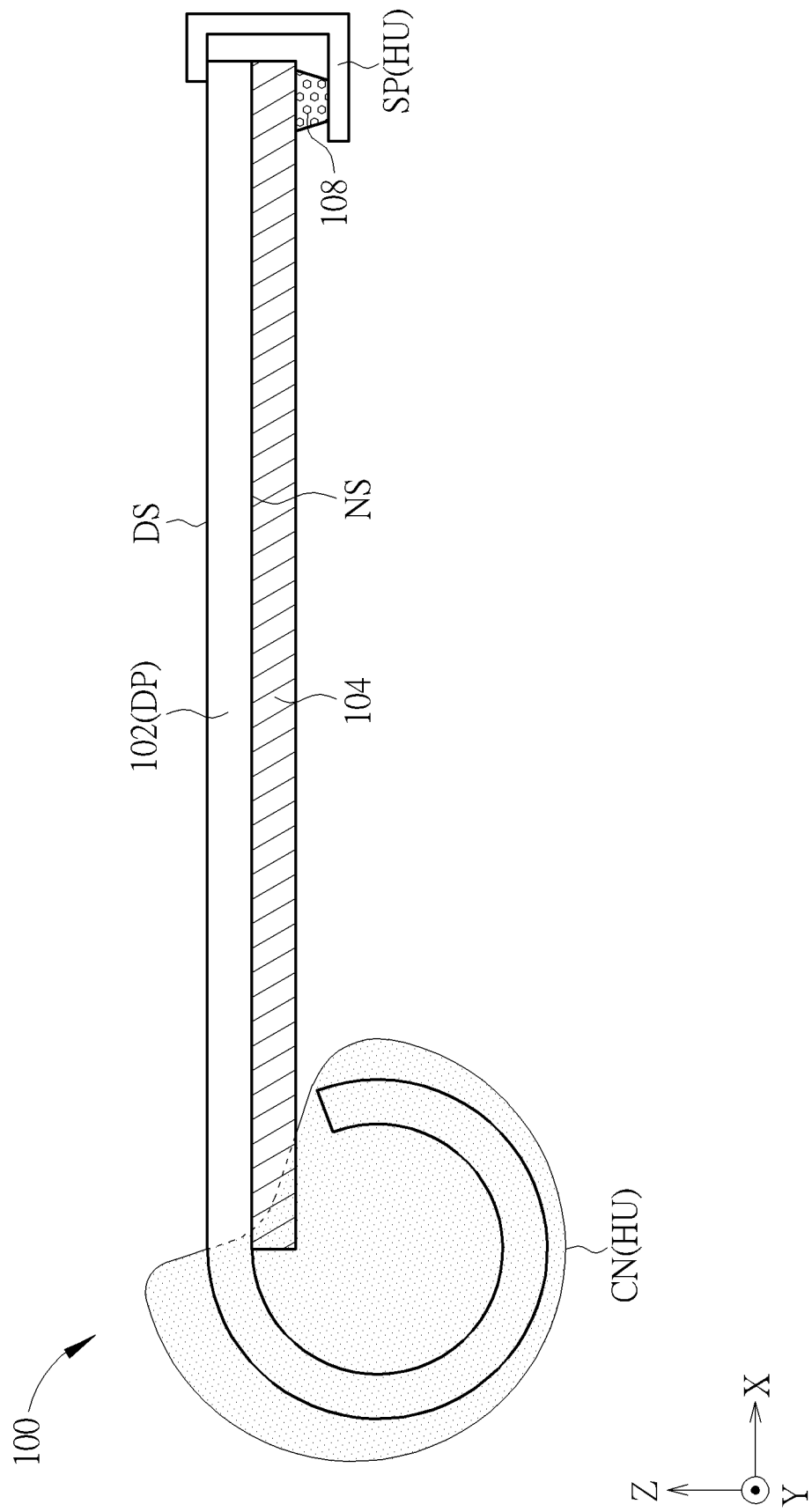
FIG. 11 schematically illustrates a cross-sectional view of a display device according to another variant embodiment of the sixth embodiment of the present disclosure.

Referring to FIG. 10 and FIG. 11, FIG. 10 schematically illustrates a cross-sectional view of a display device according to a variant embodiment of the sixth embodiment of the present disclosure, and FIG. 11 schematically illustrates a cross-sectional view of a display device according to another variant embodiment of the sixth embodiment of the present disclosure. One of the main differences between the structure shown in FIG. 10 and FIG. 11 and the structure of the sixth embodiment shown in FIG. 9 is the element connected to the discharger. As shown in FIG. 10, the discharger 104 may be a conductive layer, and the discharger 104 may be connected to a conductor through the conductive connector 108. The conductor connected to the discharger 104 may be conductive material CM shown in FIG. 10, or, the conductor may be a portion of the housing HU of the display device 100, as shown in FIG. 11. The conductive material CM and the housing HU may include conductors, and the materials thereof are not limited. For example, the materials of the conductive material CM and the housing HU may include metals, such as copper, silver, gold, zinc, iron, tin, steel, stainless steel or the combinations of the above-mentioned materials. The conductive connector 108 may be a conductive glue or a solder, wherein the conductive glue may include silver glue or anisotropic conductive adhesive, but not limited thereto. As shown in FIG. 11, the housing HU may for example include a scrolling bar portion CN and a stretching portion SP. When the rollable display panel 102 is entirely folded in the housing HU, the scrolling bar portion CN and the stretching portion SP may for example be in contact with each other and form a complete shell to protect the rollable display panel 102. When the user wants to use the display device 100, the rollable display panel 102 connected to the stretching portion SP can be unfolded and used by pulling the stretching portion SP, but not limited thereto. As shown in FIG. 11, the discharger 104 may for example be electrically connected to the stretching portion SP of the housing HU through the conductive connector 108, and because the housing HU includes the conductor, the discharger 104 may thereby be grounded, such that the static electricity accumulated in the display device 100 may be discharged, thereby reducing the problem of accumulation of static electricity in the display device 100. According to some embodiments, although it is not shown in the figure, the discharger 104 may be electrically connected to the scrolling bar portion CN of the housing HU through the conductive connector 108. The scrolling bar portion CN and/or the stretching portion SP of the housing HU may be conductors. According to some embodiments, although it is not shown in the figure, the discharger 104 may be electrically connected to the scrolling bar element (not shown) in the housing HU through the conductive connector 108, wherein the scrolling bar element may include conductive materials or metals.

Figure 12:
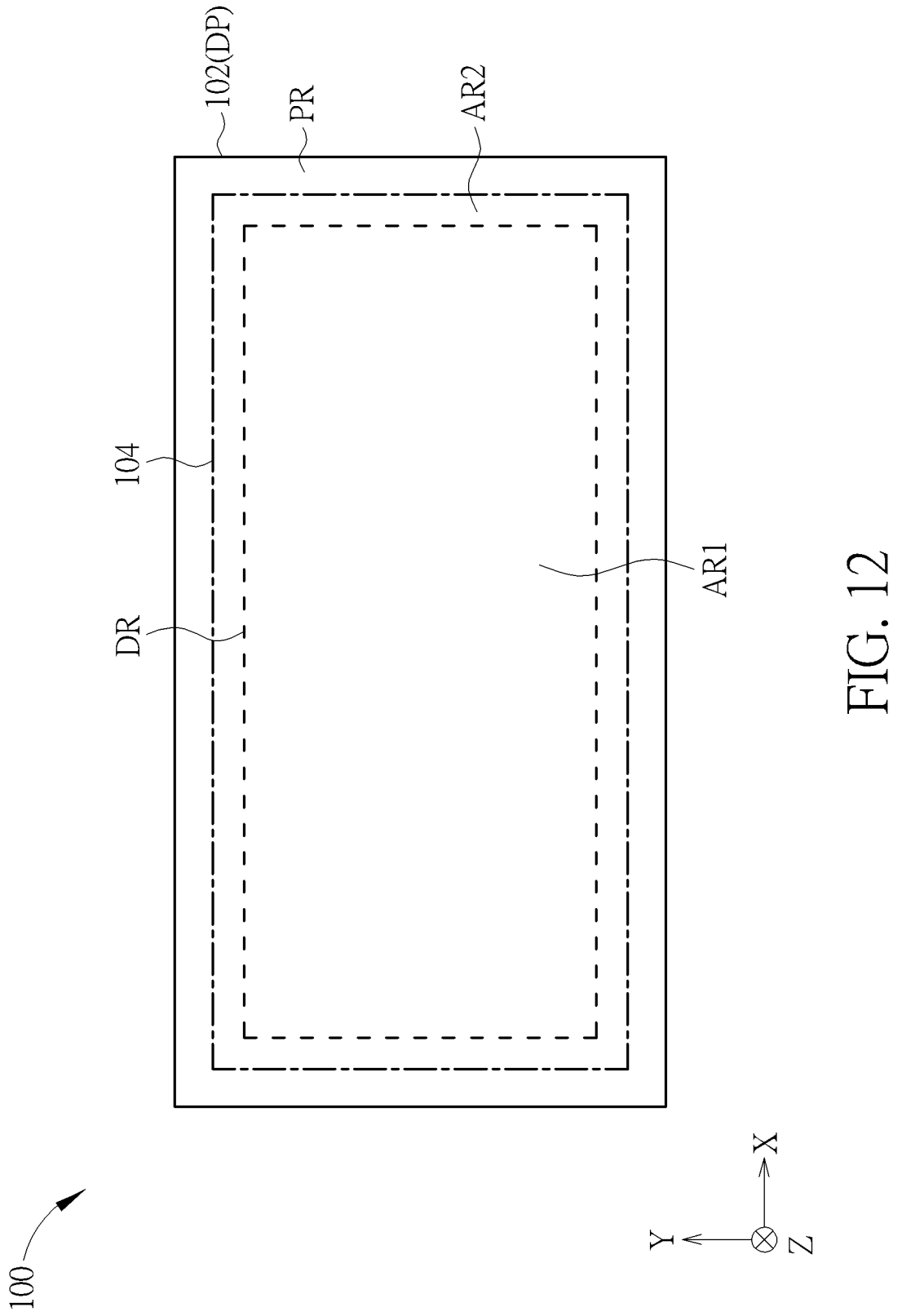
FIG. 12 schematically illustrates a top view of a display device according to a seventh embodiment of the present disclosure.

Referring to FIG. 12, FIG. 12 schematically illustrates a top view of a display device according to a seventh embodiment of the present disclosure. One of the main differences between the structure shown in FIG. 12 and the structure of the first embodiment shown in FIG. 1 is the design of the discharger. According to the present embodiment, the display device 100 may include the rollable display panel 102 and the discharger 104, and compared to the display device of the first embodiment, the discharger 104 may not be entirely disposed on the rollable display panel 102 in the present embodiment. In detail, as shown in FIG. 12, the rollable display panel 102 of the display device 100 may include the display region DR and the peripheral region (not shown in FIG. 12), wherein the discharger 104 may at least cover the display region DR of the rollable display panel 102, but not limited thereto. It should be noted that "the discharger 104 covers the display region DR" mentioned above means that the display region DR may be entirely overlapped with the discharger 104 in the direction Z, but not limited thereto. In the present embodiment, in order to make the discharger 104 cover the display region DR, the area of the discharger 104 may for example be greater than the area of the display region DR, but not limited thereto. For example, as shown in FIG. 12, the discharger 104 may have an area AR2, and the display region DR may have an area AR1, wherein the area AR2 may be greater than the area AR1, such that the display region DR may be entirely overlapped with the discharger 104, but not limited thereto. In the present embodiment, the area of the discharger 104 may for example be defined as the maximum area of the region enclosed by the outermost discharger 104, but not limited thereto. Because the discharger 104 of the present embodiment may entirely cover the display region DR, the portion of the rollable display panel 102 corresponding to the display region DR may include the discharger 104. When the user uses or rolls the display device 100, because the rollable display device 102 corresponding to the display region DR includes the discharger 104, the accumulation of static electricity in the display region DR of the rollable display panel 102 may be reduced, such that the damage of the light emitting elements or other electronic elements caused by electrostatic discharge may be reduced, thereby reducing the effect of accumulation of static electricity on the display quality of the display device 100. It should be noted that although FIG. 12 shows the structure that the area AR2 of the discharger 104 is greater than the area AR1 of the display region DR, the present disclosure is not limited thereto. In some embodiments, the discharger 104 may cover the display region DR, and the area AR2 of the discharger 104 may be equal to the area AR1 of the display region DR. In addition, the shape of the discharger 104 and the shape of the display region DR shown in FIG. 12 are exemplary, and the present disclosure is not limited thereto. In some embodiments, the shape of the discharger 104 and the shape of the display region DR may be determined according to the demands of the design of the display device 100 as long as the discharger 104 can cover the display region DR. The design of the discharger 104 mentioned in the present embodiment may be applied to each of the embodiments and variant embodiments of the present disclosure, and will not be redundantly described later.

Figure 13:
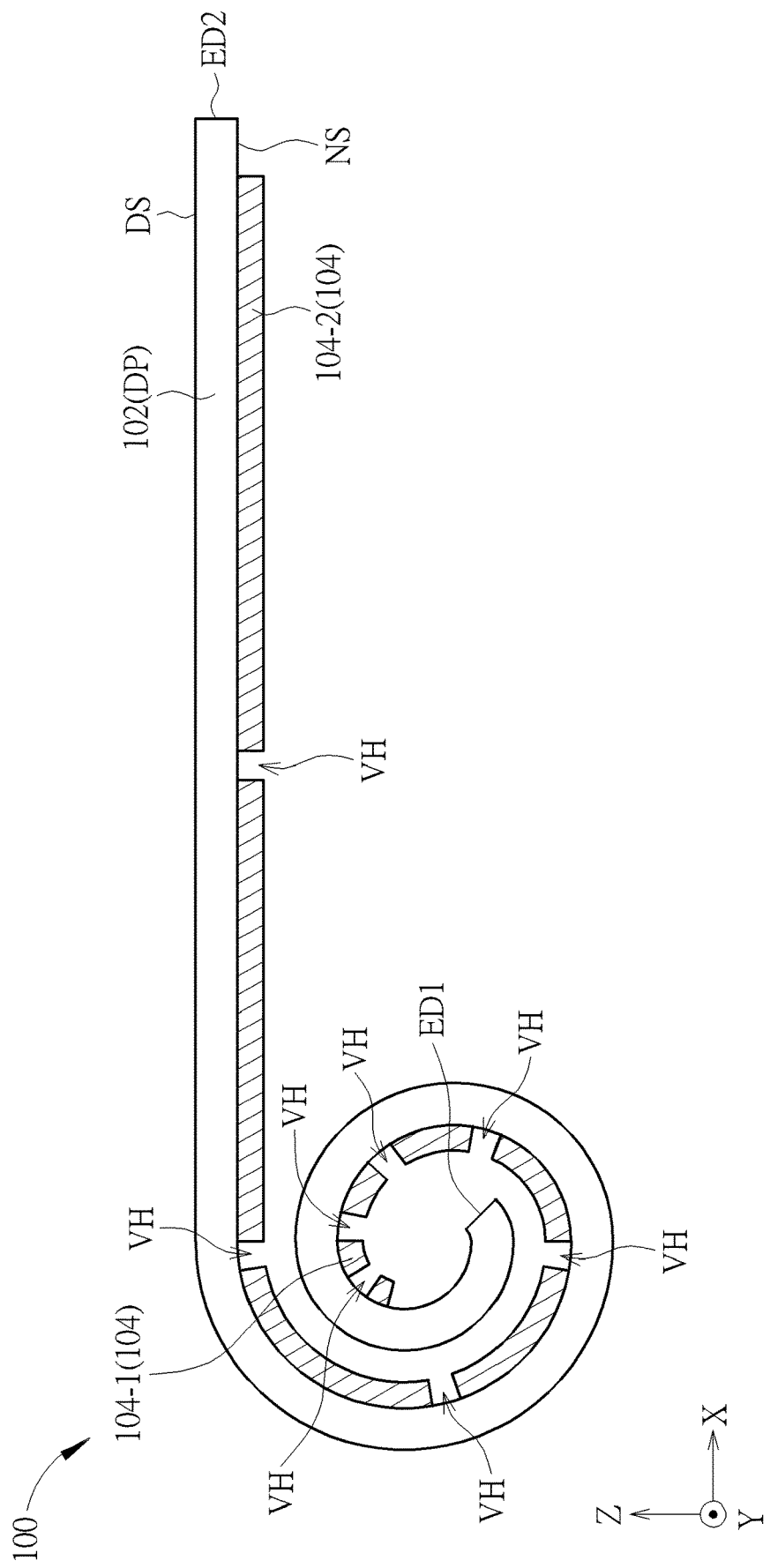
FIG. 13 schematically illustrates a cross-sectional view of a display device according to an eighth embodiment of the present disclosure.

Referring to FIG. 13, FIG. 13 schematically illustrates a cross-sectional view of a display device according to an eighth embodiment of the present disclosure. One of the main differences between the structure shown in FIG. 13 and the structure of the first embodiment shown in FIG. 1 is the design of the discharger. According to the present embodiment, the display device 100 may include the rollable display panel 102 and the discharger 104, and compared to the display device of the first embodiment, the discharger 104 may be patterned in the present embodiment. In detail, the discharger 104 may for example include a plurality of vias VH in the present embodiment, wherein the vias VH may for example penetrate through the discharger 104 and expose the non-displaying side NS of the rollable display panel 102, and the discharger 104 may be divided into a plurality of sub-dischargers (such as the sub-discharger 104-1 and the sub-discharger 104-2) by the vias VH, but not limited thereto. In addition, according to the present embodiment, as shown in FIG. 13, the sub-dischargers may include different sizes, wherein the sub-dischargers close to the edge ED1 of the rollable display panel 102 may include lower size, and the sub-dischargers close to the edge ED2 of the rollable display panel 102 may include greater size. For example, as shown in FIG. 13, the size of the sub-discharger 104-1 close to the edge ED1 of the rollable display panel 102 may be lower than the size of the sub-discharger 104-2 close to the edge ED2 of the rollable display panel 102, but not limited thereto. It should be noted that "the size of the sub-discharger" mentioned above may be defined as the area, length, width or other suitable size characteristics of the sub-discharger, the present disclosure is not limited thereto. According to the present embodiment, because the discharger 104 may include the vias VH, the flexibility of the display device 100 may be improved when the rollable display panel 102 of the display device is being rolled. In addition, as shown in FIG. 13, when the rollable display panel 102 is being rolled, the portion of the rollable display panel 102 close to the edge ED1 may be located at the inner circle, and the another portion of the rollable display panel 102 close to the edge ED2 may be located at the outer circle, such that the rollable display panel 102 close to the edge ED1 has higher demands for flexibility. However, because the size of the sub-discharger (such as the sub-discharger 104-1) close to the edge ED1 may be smaller than the size of the sub-discharger (such as the sub-discharger 104-2) close to the edge ED2 in the present embodiment, the effect of the discharger 104 on the flexibility of the display device 100 may be reduced when the rollable display panel 102 is being rolled, thereby improving the deformability of the display device 100, but not limited thereto. Furthermore, because the discharger 104 may include the vias VH in the present embodiment, the possibility of sliding of the rollable display panel 102 may be reduced when the rollable display panel 102 is being rolled, such that the possibility of friction between the layers may be reduced, thereby reducing the accumulation of static electricity in the display device 100, but not limited thereto. It should be noted that the design of the discharger of the present embodiment is not limited to what is shown in FIG. 13, and other designs capable of improving the flexibility of the display device 100 may be included. For example, the vias VH of the discharger 104 may not penetrate through the discharger 104 and expose the non-displaying side NS of the rollable display panel 102 in some embodiments, that is, the vias VH may for example be the recesses or grooves on the surface of the discharger 104. In addition, the groove-shaped or recess-shaped vias VH mentioned above may include different sizes in some embodiments, wherein the vias VH close to the edge ED1 of the rollable display panel 102 may include greater size, and the vias VH close to the edge ED2 of the rollable display panel 102 may include lower size, but not limited thereto. In some embodiments, the discharger 104 may not include the vias VH, and the thickness of the discharger 104 may be varied in different position. For example, the portion of the discharger 104 close to the edge ED1 of the rollable display panel 102 may include lower thickness, and the portion of the discharger 104 close to the edge ED2 of the rollable display panel 102 may include greater thickness, but not limited thereto. In some embodiments, the discharger 104 disposed on the rollable display panel 102 may be a mesh or include other suitable shapes, but not limited thereto. The pattern design of the discharger 104 mentioned in the present embodiment may be applied to each of the embodiments and variant embodiments of the present disclosure, and will not be redundantly described later.

Figure 14:
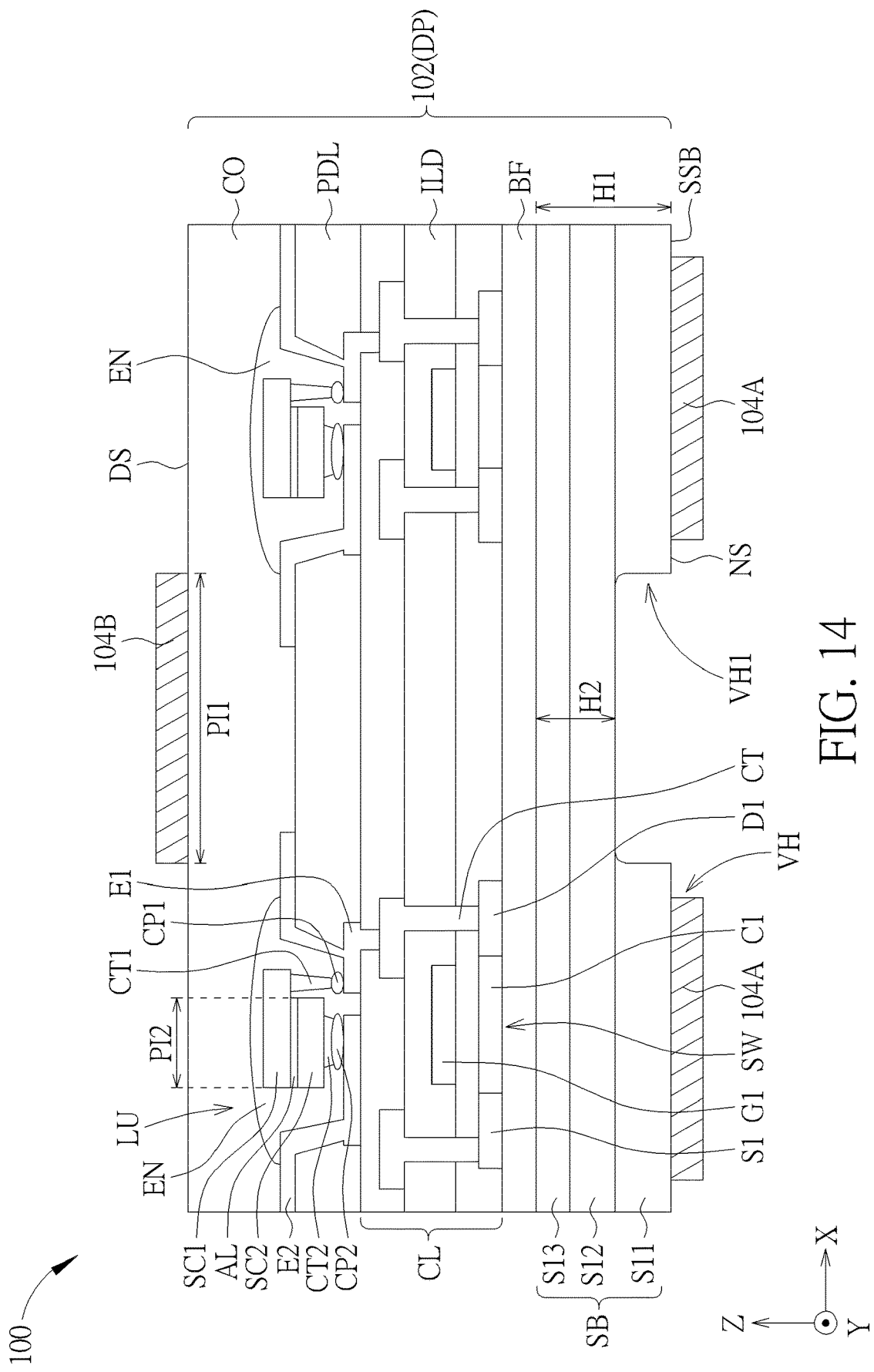
FIG. 14 schematically illustrates a cross-sectional view of a display device according to a variant embodiment of the eighth embodiment of the present disclosure.

Referring to FIG. 14, FIG. 14 schematically illustrates a cross-sectional view of a display device according to a variant embodiment of the eighth embodiment of the present disclosure. One of the main differences between the structure shown in FIG. 14 and the structure of the first embodiment shown in FIG. 2 is the design of the discharger. As shown in FIG. 14, the rollable display panel 102 may include the substrate SB, the driving elements SW and the light emitting units LU in the present variant embodiment, wherein the light emitting units LU may for example include light emitting diodes, but not limited thereto. The light emitting units LU may for example include micro light emitting diodes, and each of the light emitting units LU may include a first semiconductor layer SC1, a second semiconductor layer SC2 and an active layer AL, wherein the first semiconductor layer SC1 may be one of the p type semiconductor layer and the n type semiconductor layer, and the second semiconductor layer SC2 may be another one of the p type semiconductor layer and the n type semiconductor layer. The active layer AL may include a multi quantum well (MQW) structure. According to the present embodiment, the light emitting region of the light emitting unit LU may for example be defined by the active layer AL. For example, the area of the active layer AL may be defined as the area of the light emitting region of the light emitting unit, but not limited thereto. Each of the light emitting units LU may further include a contact CT1 and a contact CT2. The display panel DP may further include a first bonding material CP1 and a second bonding material CP2 for bonding the light emitting unit LU to the circuit layer CL in addition to the above-mentioned elements or layers, wherein the first semiconductor layer SC1 of the light emitting unit LU may be connected to the first bonding material CP1 through the contact CT1, and the second semiconductor layer SC2 of the light emitting unit LU may be connected to the second bonding material CP2 through the contact CT2. The first bonding material CP1 and the second bonding material CP2 may be electrically connected to the first electrode E1 and the second electrode E2 respectively, wherein the first electrode E1 may be electrically connected to the diving element SW, and the operation of the light emitting units LU may be controlled through the driving element SW, but not limited thereto. In some embodiments, an insulating layer EN may be disposed on the surface of the light emitting units LU, wherein the insulating layer EN may for example be served as an encapsulation layer to cover the light emitting diodes or chips of the light emitting units LU to provide the protecting function, but not limited thereto. The descriptions of the elements or the layers of the rollable display panel 102 such as the driving element SW and the cover layer CO may refer to the descriptions of the first embodiment and the structure shown in FIG. 2, and will not be redundantly described.

As shown in FIG. 14, according to the present variant embodiment, the dischargers may include a first discharger 104A disposed on the non-displaying side NS of the rollable display panel 102 and a second discharger 104B disposed on the displaying side DS of the rollable display panel 102. The second discharger 104B may for example be patterned and staggered from the light emitting units LU of the rollable display panel 102, or in other words, the second discharger 104B may not be overlapped with the light emitting units LU, but not limited thereto. Specifically, the second discharger 104B may be disposed on the cover layer CO, and the second discharger 104B may have a projection range PI1 on the cover layer CO (such as the projection area of the second discharger 104B on the cover layer CO). In addition, as mentioned above, the light emitting region of the light emitting unit LU may for example be defined by the active layer AL of the light emitting unit LU. The light emitting region of the light emitting unit LU (or the region of the active layer AL) may have a projection range PI2 on the cover layer (such as the projection area of the active layer AL on the cover layer CO). According to the present embodiment, as shown in FIG. 14, the projection range PI1 of the second discharger 104B may not be overlapped with the projection range PI2 of the light emitting region of the light emitting unit LU in a display direction (such as the direction Z, but not limited thereto), that is, the second discharger 104B is not overlapped with the light emitting units LU in the direction Z. Therefore, the effect of the second discharger 104B on the display of the rollable display device 100 may be reduced. It should be noted that the definition of the light emitting region of the light emitting unit LU of the present variant embodiment is not limited to what is shown in FIG. 14, and may include various definition methods according to the design of the light emitting unit LU.

In addition, although the projection of the light emitting region of the light emitting unit LU and the projection of the second discharger 104B on the cover layer CO are used to determine whether the light emitting region of the light emitting unit LU and the second discharger 104B are overlapped with each other in FIG. 14, the present disclosure is not limited thereto. In some embodiments, determining whether the projection of the light emitting region of the light emitting unit LU and the projection of the second discharger 104B are overlapped with each other may be performed on any plane perpendicular to the display direction (such as the direction Z). For example, the projection range PI1 and the projection range PI2 mentioned above may be the projection ranges on the substrate SB. The description of the first discharger 104A disposed on the non-displaying side NS of the rollable display panel 102 of the present variant embodiment may refer to the description of the discharger 104 mentioned in the embodiments and variant embodiments above, and will not be redundantly described. In addition, the substrate SB of the rollable display panel 102 may include a via VH1 located on the lower surface SSB of the substrate SB in some embodiments, but not limited thereto. Furthermore, the first discharger 104A may further include a via VH disposed corresponding to the via VH1 of the substrate SB. The via VH1 and/or the via VH may for example improve the flexibility of the rollable display panel 102. For the convenience of description, only one via VH1 and one via VH are shown in FIG. 14, but the present embodiment is not limited thereto. The substrate SB of the present embodiment may include a plurality of vias VH1, and the first discharger 104A may include a plurality of vias VH. As shown in FIG. 14, a portion of the substrate SB corresponding to the via VH1 may include a thickness H2, and another portion of the substrate SB not corresponding to the via VH1 may include a thickness H1, wherein the thickness H1 may be greater than the thickness H2, but not limited thereto. It should be noted that although the substrate SB shown in FIG. 14 includes a multi-layer structure, the present disclosure is not limited thereto. In some embodiments, the substrate SB may be a single layer. As shown in FIG. 14, when the substrate SB includes the multi-layer structure, the substrate SB may include a first layer S11, a second layer S12 and a third layer S13 in sequence starting from the farthest from the display surface DS. As shown in FIG. 14, the via VH1 may be formed by penetrating through the first layer S11, but not limited thereto. In some embodiments, although it is not shown in the figure, the via VH1 may be formed by thinning but not penetrating through the first layer S11. In some embodiments, although it is not shown in the figure, the via VH1 may be formed by penetrating through the first layer S11 and the second layer S12. In some embodiments, although it is not shown in the figure, the via VH1 may be formed by penetrating through the first layer S11 and the second layer S12 and remaining at least a portion of the third layer S13. In addition, although the first discharger 104A shown in FIG. 14 is disposed corresponding to the light emitting units LU or the light emitting region of the rollable display panel 102, it is just exemplary, and the present embodiment is not limited thereto. The disposition methods of the first discharger 104A, the via VH and the via VH1 of the substrate SB may be varied according to the demands of the design.

Figure 15:
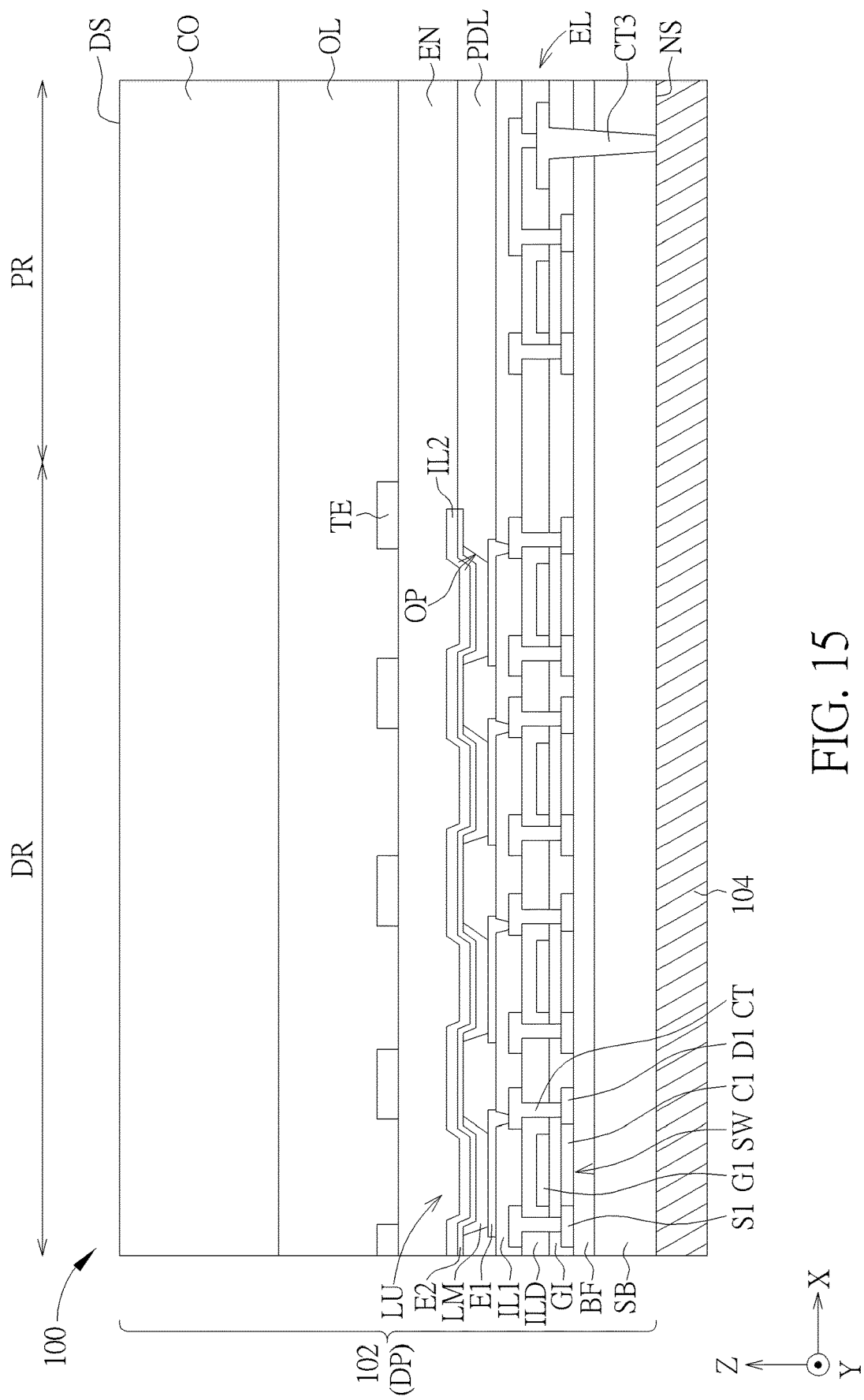
FIG. 15 schematically illustrates a cross-sectional view of a display device according to a ninth embodiment of the present disclosure.

Referring to FIG. 15, FIG. 15 schematically illustrates a cross-sectional view of a display device according to a ninth embodiment of the present disclosure. One of the main differences between the structure shown in FIG. 15 and the structure of the first embodiment shown in FIG. 2 is the design of the discharger. As shown in FIG. 15, the rollable display panel 102 may further include a discharger EL, wherein the discharger EL may be electrically connected to the discharger 104 out of the rollable display panel 102 through a contact CT3. The discharger EL of the present embodiment may include any element capable of reducing the possibility of electrostatic discharge of the display device 100. For example, the discharger EL shown in FIG. 15 may for example include the ESD diode, but not limited thereto. In addition, according to the present embodiment, the discharger EL may for example be disposed in the peripheral region PR of the rollable display panel 102, but not limited thereto. Because the display device 100 of the present embodiment may include the discharger EL electrically connected to the discharger 104, the accumulation of static electricity in the display device 100 may be reduced. In addition, because the discharger EL may be disposed in the peripheral region PR of the rollable display panel 102, the effect of the discharger EL on the display of the rollable display panel 102 may be reduced. The feature that the display device 100 includes the discharger EL mentioned in the present embodiment may be applied to each of the embodiments and variant embodiments of the present disclosure.

In summary, a display device is provided by the present disclosure, wherein the display device includes a rollable display panel and a discharger. When the rollable display panel is being rolled, the discharger may be located between a first portion and a second portion of the rollable display panel, and according to some embodiments, the frictions between the layers of the rollable display panel may be reduced, such that the electrostatic discharge of the display device may be reduced, thereby improving the yield of the display device.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
   a rollable panel comprising a first portion and a second portion, the rollable panel having a first side and a second side opposite to the first side, the rollable panel comprising:
      a substrate;
      a circuit layer disposed on the substrate; and
      a cover layer disposed on the circuit layer; and
   a metal layer disposed on one of the first side and the second side of the rollable panel and outside the rollable panel,
   wherein in a rolled mode, at least a part of the metal layer is positioned between the first portion and the second portion of the rollable panel.

2. The electronic device of claim 1, wherein the rollable panel has a first edge and a second edge opposite to the first edge, in the rolled mode, the rollable panel comprises a rolled structure and a non-rolled structure, and the rolled structure comprises the first edge, the metal layer comprises a first metal pattern and a second metal pattern, the first metal pattern is closer to the first edge than the second metal pattern, and a size of the first metal pattern is smaller than a size of the second metal pattern.

3. The electronic device of claim 2, wherein a thickness of the first metal pattern is smaller than a thickness of the second metal pattern.

4. The electronic device of claim 2, wherein a width of the first metal pattern is smaller than a width of the second metal pattern.

5. The electronic device of claim 1, wherein the rollable panel has a first edge and a second edge opposite to the first edge, in the rolled mode, the rollable panel comprises a rolled structure and a non-rolled structure, and the rolled structure comprises the first edge, the metal layer comprises a first via and a second via, the first via is closer to the first edge than the second via, and a size of the first via is greater than a size of the second via.

6. The electronic device of claim 1, wherein in the rolled mode, a part of the metal layer is rolled with the rollable panel, and the part of the metal layer comprises a via.

7. The electronic device of claim 1, wherein in the rolled mode, the rollable panel comprises a rolled structure and a non-rolled structure, the rolled structure comprises the first portion, and the non-rolled structure comprises the second portion.

8. The electronic device of claim 1, wherein in the rolled mode, the rollable panel comprises a rolled structure and a non-rolled structure, the first portion is disposed in an inner side of the rolled structure, and the second portion is disposed in an outer side of the rolled structure.

9. The electronic device of claim 1, wherein the metal layer has an electrical conductivity in a range from $10^4$ to $10^8$ $ohm^{-1}m^{-1}$.

10. The electronic device of claim 1, wherein the cover layer has an outer surface at the first side of the rollable panel, and the metal layer is disposed on the second side of the rollable panel.

11. The electronic device of claim 1, further comprising a display layer disposed between the cover layer and the circuit layer.

12. The electronic device of claim 1, further comprising a conductive material electrically connected to the metal layer.

13. The electronic device of claim 12, wherein the conductive material is included in a housing.

14. The electronic device of claim 12, wherein the conductive material is included in a printed circuit board.

* * * * *